United States Patent
Silverbrook (12)

(10) Patent No.: US 6,312,070 B1
(45) Date of Patent: Nov. 6, 2001

(54) RECYCLING OF MULTI—USE DIGITAL INSTANT PRINTING CAMERA SYSTEMS

(75) Inventor: Kia Silverbrook, Sydney (AU)

(73) Assignee: Silverbrook Research Pty Ltd, Balmain (AU)

(*) Notice: Subject to any disclaimer, the term of this patent is extended or adjusted under 35 U.S.C. 154(b) by 0 days.

(21) Appl. No.: 09/112,766

(22) Filed: Jul. 10, 1998

(30) Foreign Application Priority Data

Jul. 15, 1997 (AU) .................................................. PO7991
Dec. 12, 1997 (AU) .................................................. PP0884

(51) Int. Cl.[7] ............................... B41J 3/00; H04N 5/225
(52) U.S. Cl. ............................................. 347/2; 348/207
(58) Field of Search .................................. 347/2, 3, 5, 14, 347/19; 358/296, 474, 400, 401, 482; 348/207

(56) References Cited

U.S. PATENT DOCUMENTS 5,363,134 * 11/1994 Barbehenn et al. ..................... 347/49
5,847,836 * 12/1998 Suzuki .................................. 358/296

FOREIGN PATENT DOCUMENTS

| WO91/14336 | 9/1991 | (WO) . |
| WO 93/16323 | 6/1995 | (WO) . |
| WO 97/06958 | 2/1997 | (WO) . |
| WO98/18253 | 4/1998 | (WO) . |

* cited by examiner

Primary Examiner—John Barlow
Assistant Examiner—Charles W. Stewart, Jr.

(57) ABSTRACT

A handheld camera system is disclosed comprising an image sensor device for sensing an image; a processing means for processing the sensed image; a storage means for storing images and programs for utilization by the processor means; a print media stored internally to the camera system; a print head for printing the sensed image on the print media; an alterable switch for storing a current state of output types of the camera system; a switch interconnected to the processing means and having a number of predetermined states and the processing means adapted to monitor the switch state and process the sensed image in accordance with the switch state to cause the print head to output a corresponding modified image in accordance with the switch state.

9 Claims, 23 Drawing Sheets

RECYCLING OF MULTI—USE DIGITAL INSTANT PRINTING CAMERA SYSTEMS

CROSS REFERENCES TO RELATED APPLICATIONS

The following Australian provisional patent applications are hereby incorporated by cross-reference. For the purposes of location and identification, U.S. patent applications identified by their U.S. patent application Ser. No. (USSN) are listed alongside the Australian applications from which the U.S. patent applications claim the right of priority.

| Cross-Referenced Australian Provisional Patent No. | U.S. patent application (Claiming Right of Priority From Australian Provisional Application) | Docket No. |
| --- | --- | --- |
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740 | ART13 |
| PO7997 | 09/112,739 | ART15 |
| PO7979 | 09/113,053 | ART16 |
| PO8015 | 09/112,738 | ART17 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 09/112,797 | ART30 |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 09/112,791 | ART61 |
| PO9400 | 09/112,790 | ART62 |
| PO9401 | 09/112,789 | ART63 |
| PO9402 | 09/112,788 | ART64 |
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751 | IJ01 |
| PO8072 | 09/112,787 | IJ02 |
| PO8040 | 09/112,802 | IJ03 |
| PO8071 | 09/112,803 | IJ04 |
| PO8047 | 09/113,097 | IJ05 |
| PO8035 | 09/113,099 | IJ06 |
| PO8044 | 09/113,084 | IJ07 |
| PO8063 | 09/113,066 | IJ08 |
| PO8057 | 09/112,778 | IJ09 |
| PO8056 | 09/112,779 | IJ10 |
| PO8069 | 09/113,077 | IJ11 |
| PO8049 | 09/113,061 | IJ12 |
| PO8036 | 09/112,818 | IJ13 |
| PO8048 | 09/112,816 | IJ14 |
| PO8070 | 09/112,772 | IJ15 |
| PO8067 | 09/112,819 | IJ16 |
| PO8001 | 09/112,815 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755 | IJ32 |
| PP0888 | 09/112,754 | IJ33 |
| PP0891 | 09/112,811 | IJ34 |
| PP0890 | 09/112,812 | IJ35 |
| PP0873 | 09/112,813 | IJ36 |
| PP0993 | 09/112,814 | IJ37 |
| PP0890 | 09/112,764 | IJ38 |
| PP1398 | 09/112,765 | IJ39 |
| PP2592 | 09/112,767 | IJ40 |
| PP2593 | 09/112,768 | IJ41 |
| PP3991 | 09/112,807 | IJ42 |
| PP3987 | 09/112,806 | IJ43 |
| PP3985 | 09/112,820 | IJ44 |
| PP3983 | 09/112,821 | IJ45 |
| PO7935 | 09/112,822 | IJM01 |
| PO7936 | 09/112,825 | IJM02 |
| PO7937 | 09/112,826 | IJM03 |
| PO8061 | 09/112,827 | IJM04 |
| PO8054 | 09/112,828 | IJM05 |
| PO8065 | 09/113,111 | IJM06 |
| PO8055 | 09/113,108 | IJM07 |
| PO8053 | 09/113,109 | IJM08 |
| PO8078 | 09/113,123 | IJM09 |
| PO7933 | 09/113,114 | IJM10 |
| PO7950 | 09/113,115 | IJM11 |
| PO7949 | 09/113,129 | IJM12 |
| PO8060 | 09/113,124 | IJM13 |
| PO8059 | 09/113,125 | IJM14 |
| PO8073 | 09/113,126 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |
| PO7948 | 09/113,117 | IJM21 |
| PO7951 | 09/113,113 | IJM22 |
| PO8074 | 09/113,130 | IJM23 |
| PO7941 | 09/113,110 | IJM24 |
| PO8077 | 09/113,112 | IJM25 |

-continued

| Cross-Referenced Australian Provisional Patent No. | U.S. patent application (Claiming Right of Priority From Australian Provisional Application) | Docket No. |
| --- | --- | --- |
| PO8058 | 09/113,087 | IJM26 |
| PO8051 | 09/113,074 | IJM27 |
| PO8045 | 09/113,089 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833 | IJM40 |
| PP2591 | 09/112,832 | IJM41 |
| PP3990 | 09/112,831 | IJM42 |
| PP3986 | 09/112,830 | IJM43 |
| PP3984 | 09/112,836 | IJM44 |
| PP3982 | 09/112,835 | IJM45 |
| PP0895 | 09/113,102 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773 | IR17 |
| PP0879 | 09/112,774 | IR18 |
| PP0883 | 09/112,775 | IR19 |
| PP0880 | 09/112,745 | IR20 |
| PP0881 | 09/113,092 | IR21 |
| PO8006 | 09/113,100 | MEMS02 |
| PO8007 | 09/113,093 | MEMS03 |
| PO8008 | 09/113,062 | MEMS04 |
| PO8010 | 09/113,064 | MEMS05 |
| PO8011 | 09/113,082 | MEMS06 |
| PO7947 | 09/113,081 | MEMS07 |
| PO7944 | 09/113,080 | MEMS09 |
| PO7946 | 09/113,079 | MEMS10 |
| PO9393 | 09/113,065 | MEMS11 |
| PP0875 | 09/113,078 | MEMS12 |
| PP0894 | 09/113,075 | MEMS13 |

STATEMENT REGARDING FEDERALLY SPONSORED RESEARCH OR DEVELOPMENT

Not applicable.

FIELD OF THE INVENTION

The present invention relates substantially to the concept of a disposable camera having instant printing capabilities and in particular, discloses multi-use camera system.

BACKGROUND OF THE INVENTION

Recently, the concept of a "single use" disposable camera has become an increasingly popular consumer item. Disposable camera systems presently on the market normally include an internal film roll and a simplified gearing mechanism for traversing the film roll across an imaging system including a shutter and lensing system. The user, after utilising a single film roll returns the camera system to a film development centre for processing. The film roll is taken out of the camera system and processed and the prints returned to the user. The camera system is then able to be re-manufactured through the insertion of a new film roll into the camera system, the replacement of any worn or wearable parts and the re-packaging of the camera system in accordance with requirements. In this way, the concept of a single use "disposable" camera is provided to the consumer.

In the field of photography, three important effects are of great relevance. The first is the distinction between colour and black and white. A significant portion of photography now utilises colour, however a non-insignificant portion of photography still is steeped in the field of black and white photography. Additionally, sepia tones have been generally utilised in traditional camera photography and are still highly popular for the production of traditional looking camera photographs especially with wedding photos or the like. It would therefore be desirable to be able to readily provide for the selection between these multiple different types of outputs such that a user can readily utilise any of the different output formats.

Further, it is desirable to provide as versatile a one time use camera system as possible so that it can produce a substantially number of different specialized effects instantly on demand.

SUMMARY OF THE INVENTION

It is an object of the present invention to provide for an efficient and effective operation of a print on demand camera system.

In accordance with a first aspect of the present invention, there is provided a handheld camera system comprising an image sensor device for sensing an image; a processing means for processing the sensed image; a storage means for storing images and programs for utilization by the processor means; a print media stored internally to the camera system; a print head for printing the sensed image on the print media; an alterable switch for storing a current state of output types of the camera system; a switch interconnected to the processing means and having a number of predetermined states and the processing means adapted to monitor the switch state and process the sensed image in accordance with the switch state to cause the print head to output a corresponding modified image in accordance with the switch state.

Preferably, the processing means is adapted to output at least two images from the group of: digitally enhanced standard color images, sepia color images, black and white images, black and white images with minor color additions, multi-passport photograph images, sketch simulated images, bordered images, panoramic images, images with additional clip arts, kaleidoscope effect images, or color modified images.

The processing means and the switch can be created on a single integrated circuit device, the device being programmable by an externally device with the switch being externally programmable. The camera system can also comprise a detachable jacket having printed information on the surface thereof indicative of the type of effect produced by the current state of the switch.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED AND OTHER EMBODIMENTS

Figure 1:
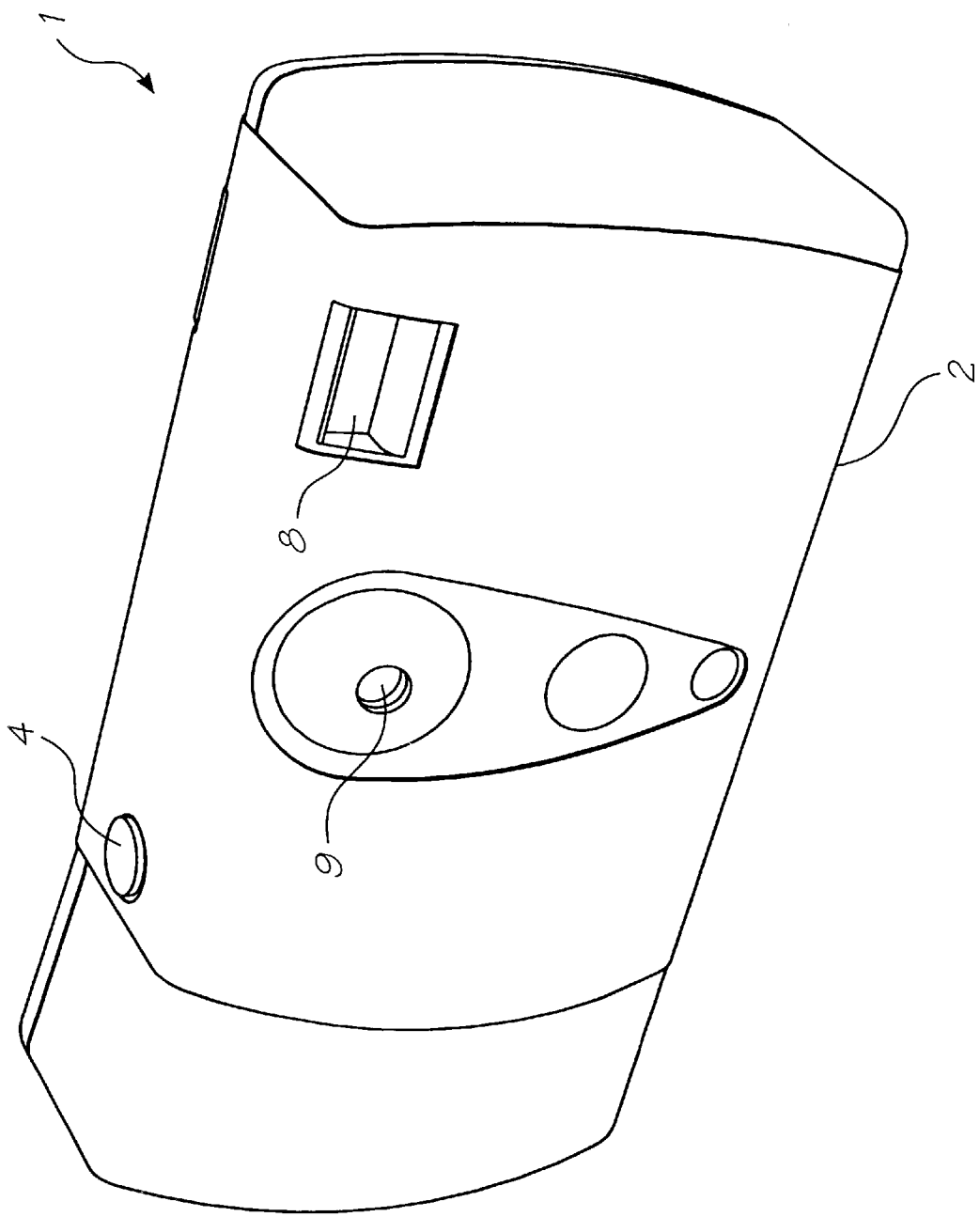
FIG. 1 illustrates a front perspective view of the assembled camera of the preferred embodiment.
Figure 2:
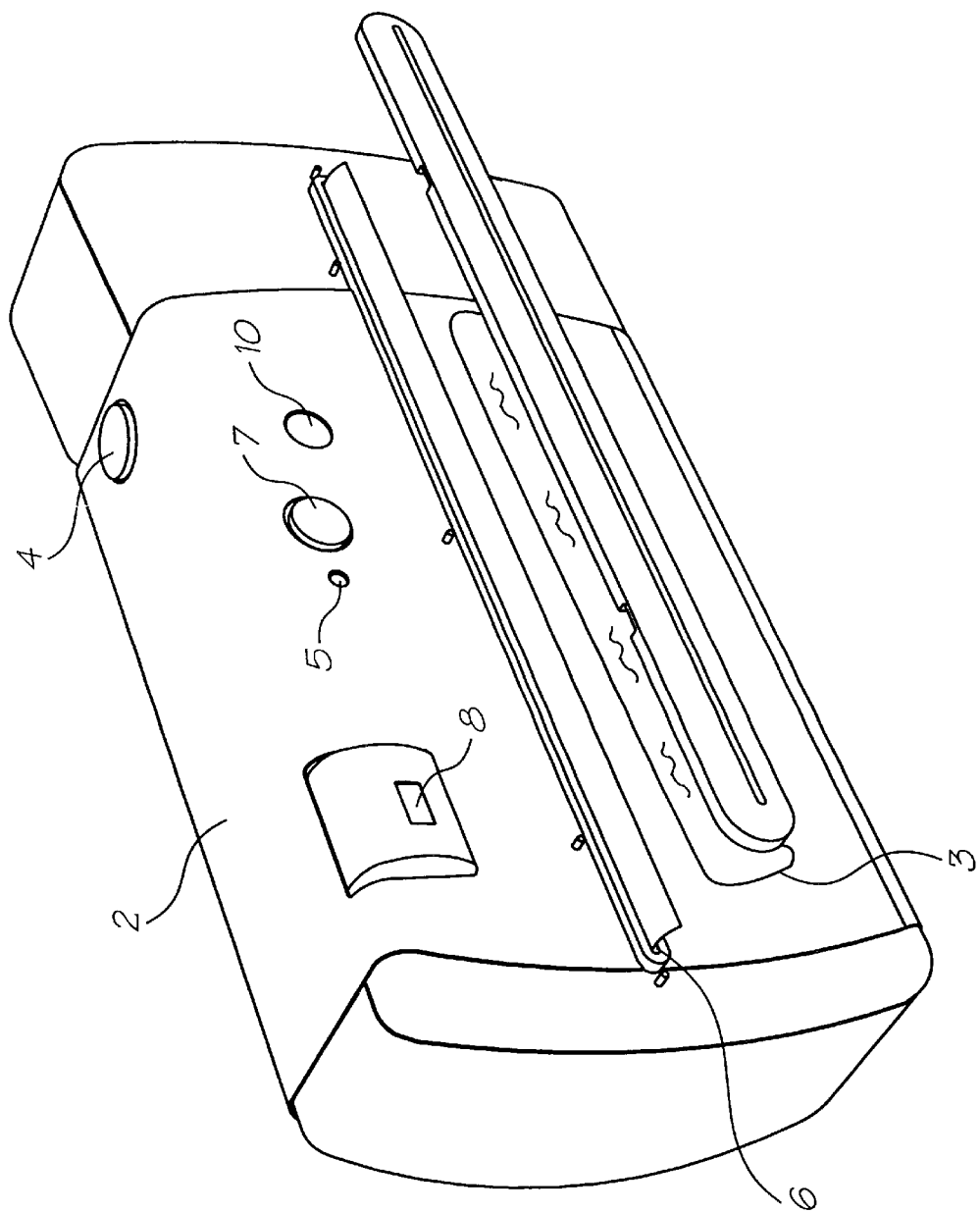
FIG. 2 illustrates a rear perspective view, partly exploded, of the preferred embodiment.

Turning initially simultaneously to FIG. 1 and FIG. 2 there are illustrated perspective views of an assembled camera constructed in accordance with the preferred embodiment with FIG. 1 showing a front perspective view and FIG. 2 showing a rear perspective view. The camera 1 includes a paper or plastic film jacket 2 which can include simplified instructions 3 for the operation of the camera system 1. The camera system 1 includes a first "take" button 4 which is depressed to capture an image. The captured image is output via output slot 6. A further copy of the image can be obtained through depressing a second "printer copy" button 7 whilst an LED light 5 is illuminated. The camera system also provides the usual view finder 8 in addition to a CCD image capture/lensing system 9.

The camera system 1 provides for a standard number of output prints after which the camera system 1 ceases to function. A prints left indicator slot 10 is provided to indicate the number of remaining prints. A refund scheme at the point of purchase is assumed to be operational for the return of used camera systems for recycling.

Figure 3:
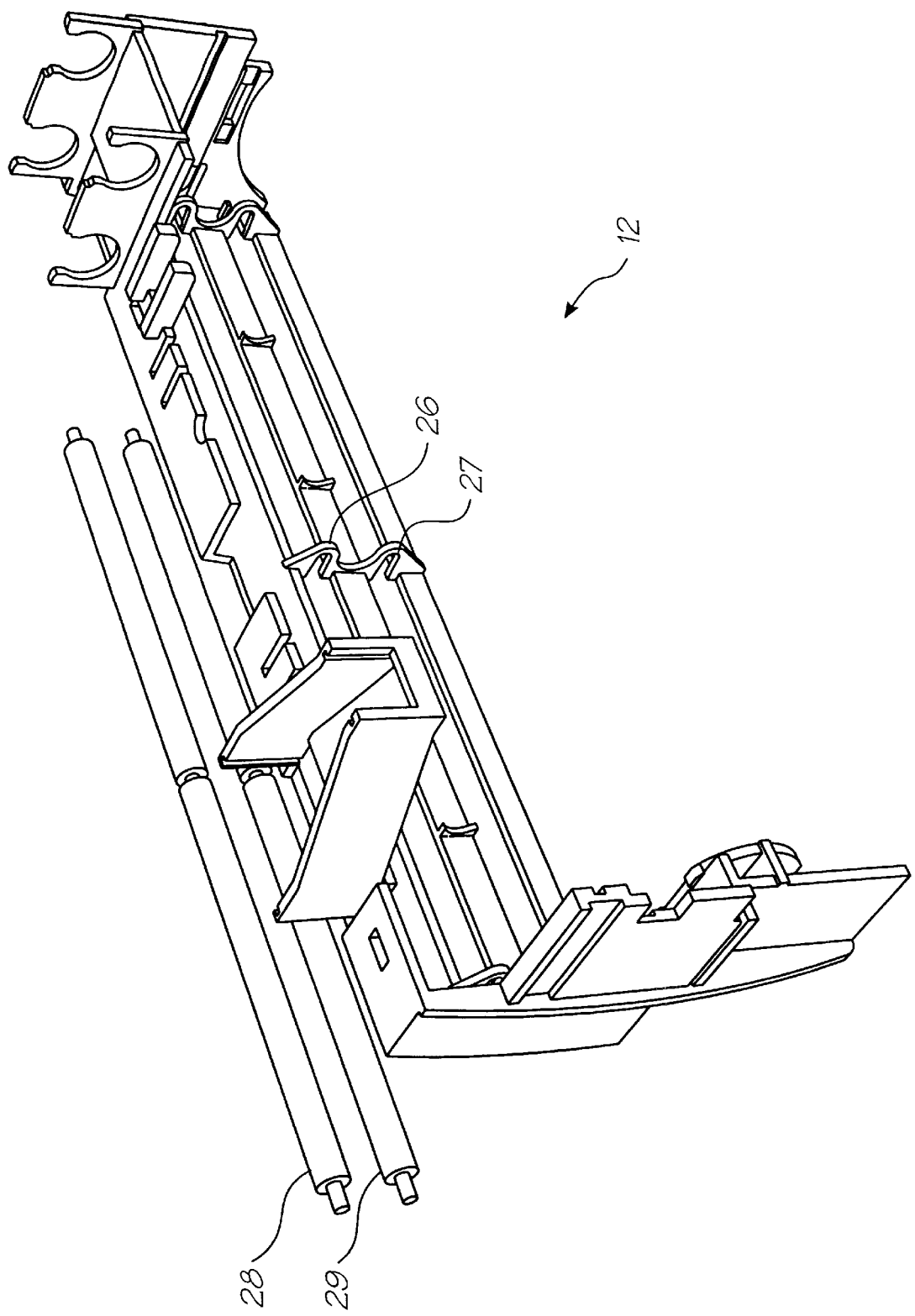
FIG. 3 is a perspective view of the chassis of the preferred embodiment.

Turning now to FIG. 3, the assembly of the camera system is based around an internal chassis 12 which can be a plastic injection molded part. A pair of paper pinch rollers 28, 29 utilized for decurling are snap fitted into corresponding frame holes eg. 26, 27.

Figure 4:
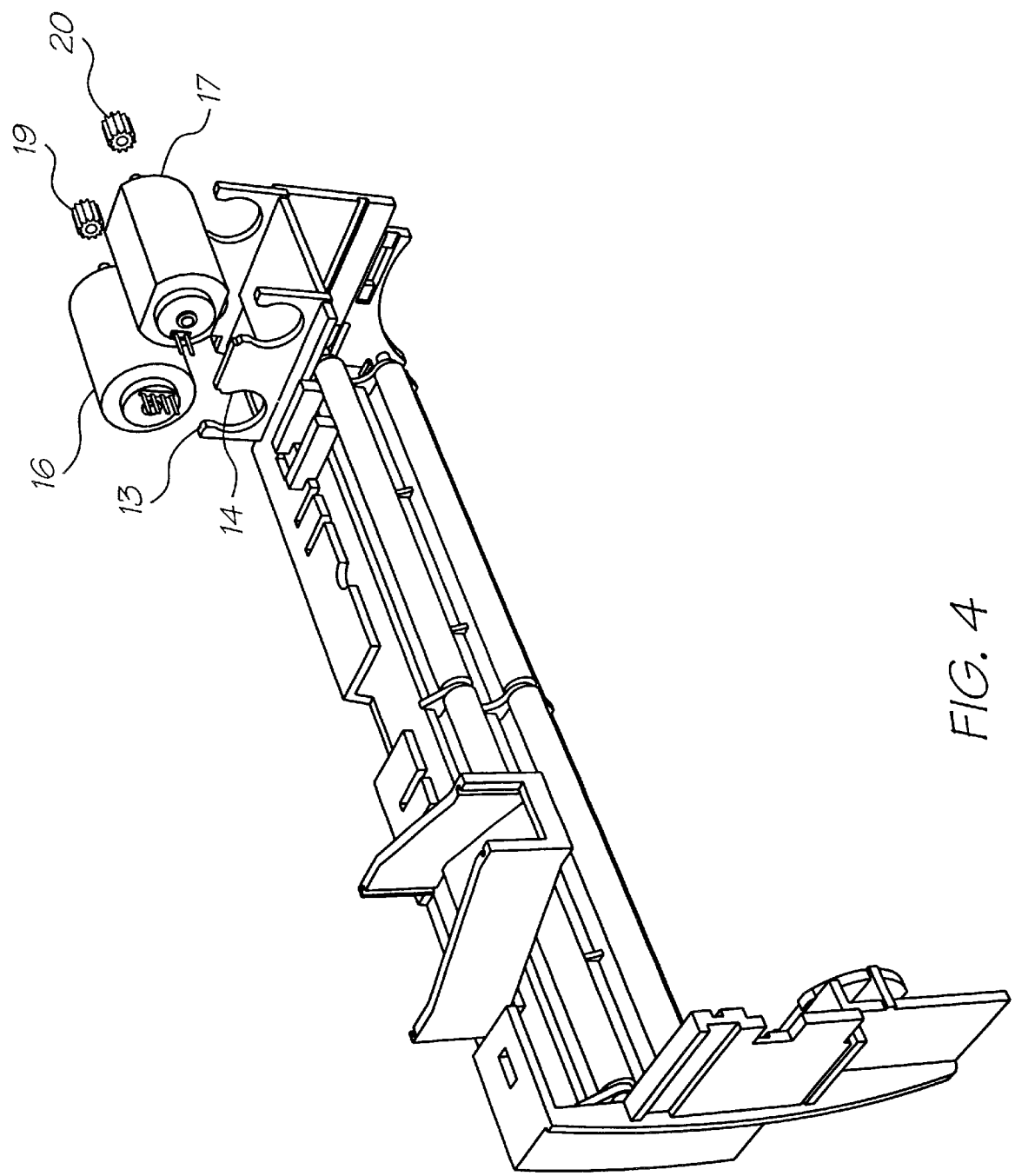
FIG. 4 is a perspective view of the chassis illustrating mounting of electric motors.

As shown in FIG. 4, the chassis 12 includes a series of mutually opposed prongs eg. 13, 14 into which is snapped fitted a series of electric motors 16, 17. The electric motors 16, 17 can be entirely standard with the motor 16 being of a stepper motor type. The motors 16, 17 include cogs 19, 20 for driving a series of gear wheels. A first set of gear wheels is provided for controlling a paper cutter mechanism and a second set is provided for controlling print roll movement.

Figure 5:
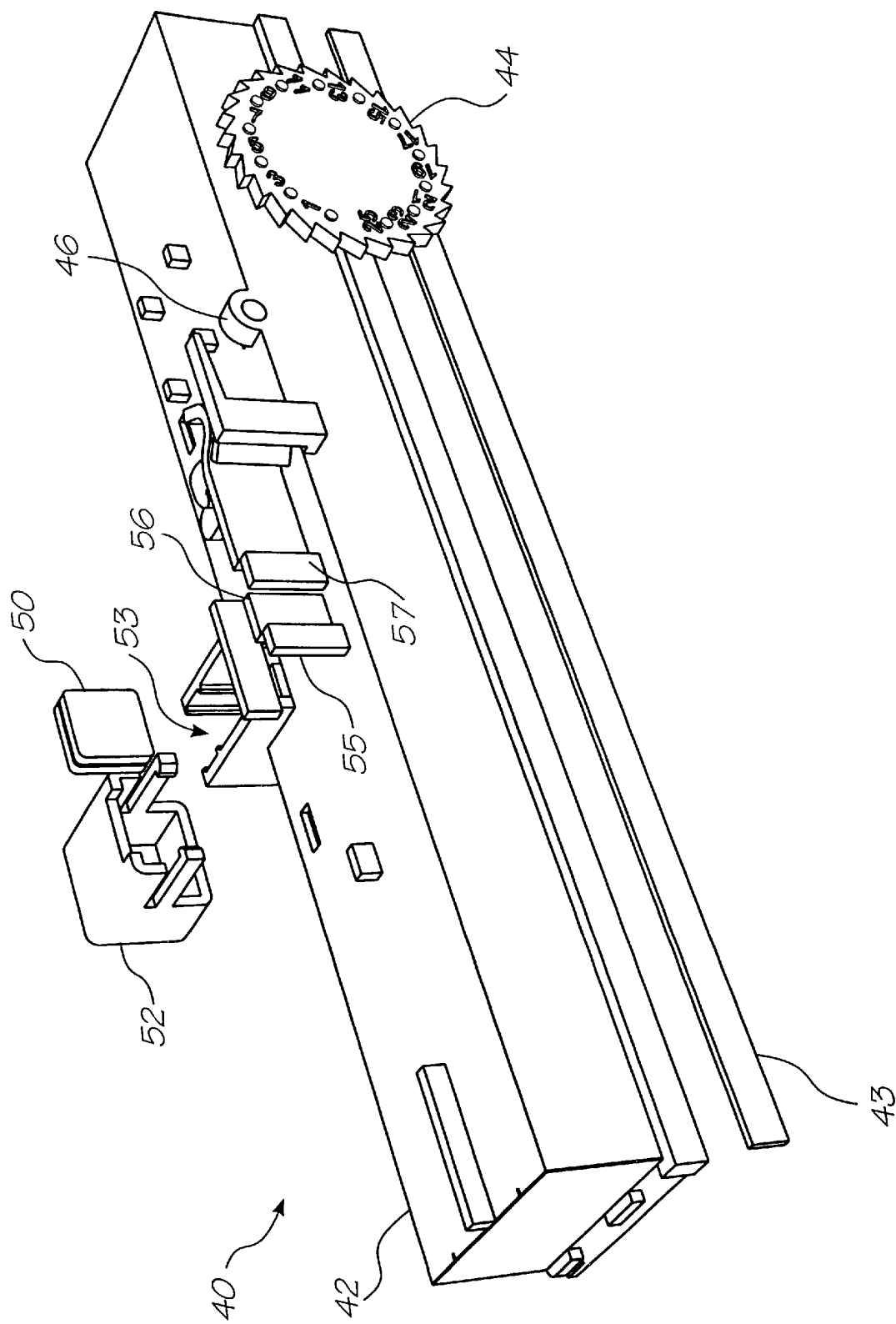
FIG. 5 is an exploded perspective view of the ink supply mechanism of the preferred embodiment.
Figure 6:
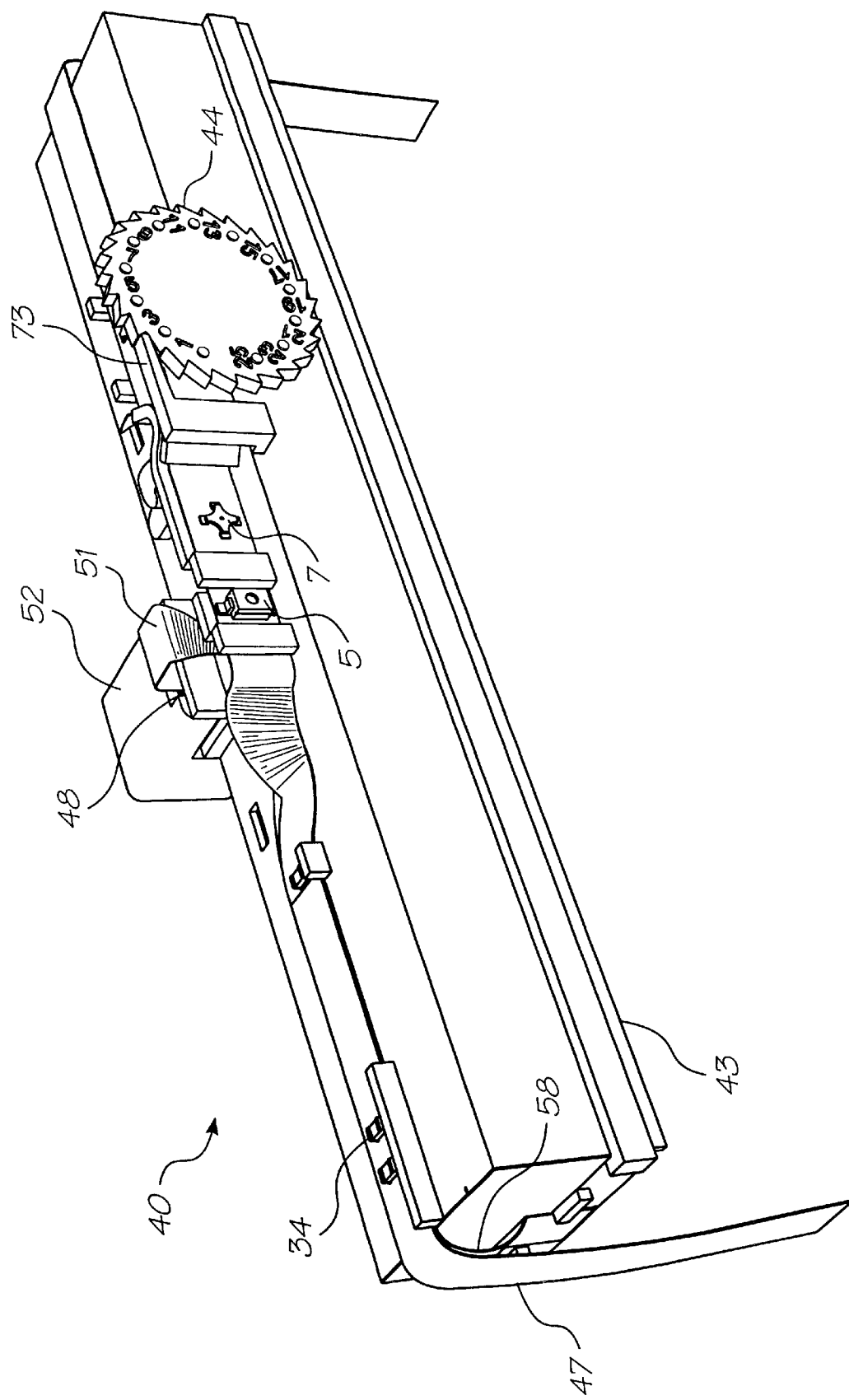
FIG. 6 is a rear perspective view of the assembled form of the ink supply mechanism of the preferred embodiment.
Figure 7:
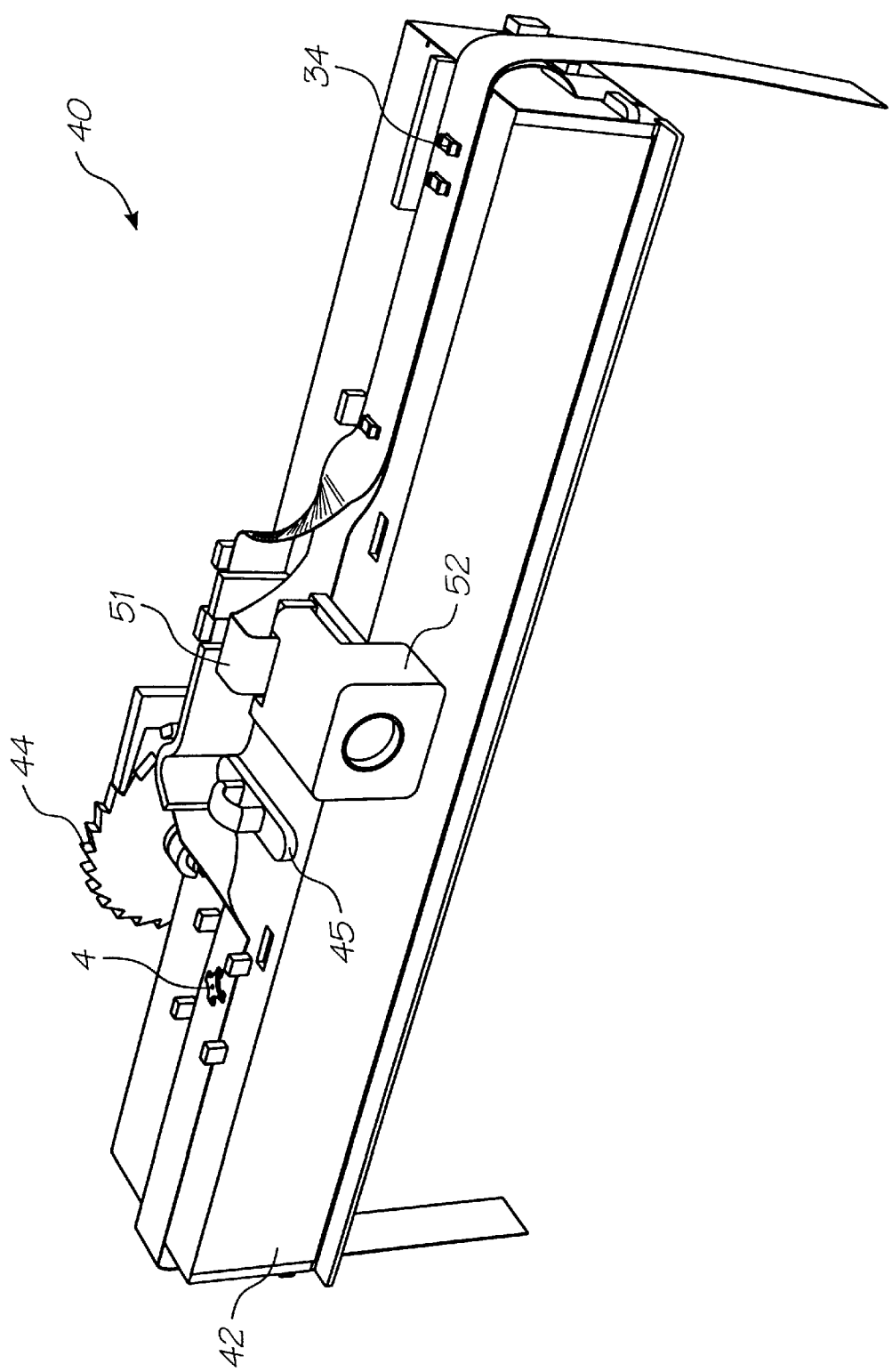
FIG. 7 is a front perspective view of the assembled form of the ink supply mechanism of the preferred embodiment.

Turning next to FIGS. 5 to 7, there is illustrated an ink supply mechanism 40 utilized in the camera system. FIG. 5 illustrates a rear exploded perspective view, FIG. 6 illustrates a rear assembled perspective view and FIG. 7 illustrates a front assembled view. The ink supply mechanism 40 is based around an ink supply cartridge 42 which contains printer ink and a print head mechanism for printing out pictures on demand. The ink supply cartridge 42 includes a side aluminium strip 43 which is provided as a shear strip to assist in cutting images from a paper roll.

A dial mechanism 44 is provided for indicating the number of "prints left". The dial mechanism 44 is snap fitted through a corresponding mating portion 46 so as to be freely rotatable.

As shown in FIG. 6, the mechanism 40 includes a flexible PCB strip 47 which interconnects with the print head and provides for control of the print head. The interconnection between the Flex PCB strip and an image sensor and print head chip can be via Tape Automated Bonding (TAB) strips 51, 58. A moulded aspherical lens and aperture shim 50 (FIG. 5) is also provided for imaging an image onto the surface of the image sensor chip normally located within cavity 53 and a light box module or hood 52 is provided for snap fitting over the cavity 53 so as to provide for proper light control. A series of decoupling capacitors eg. 34 can also be provided Further a plug 45 (FIG. 7) is provided for re-plugging ink holes after refilling. A series of guide prongs eg. 55–57 are further provided for guiding the flexible PCB strip 47.

Figure 8:
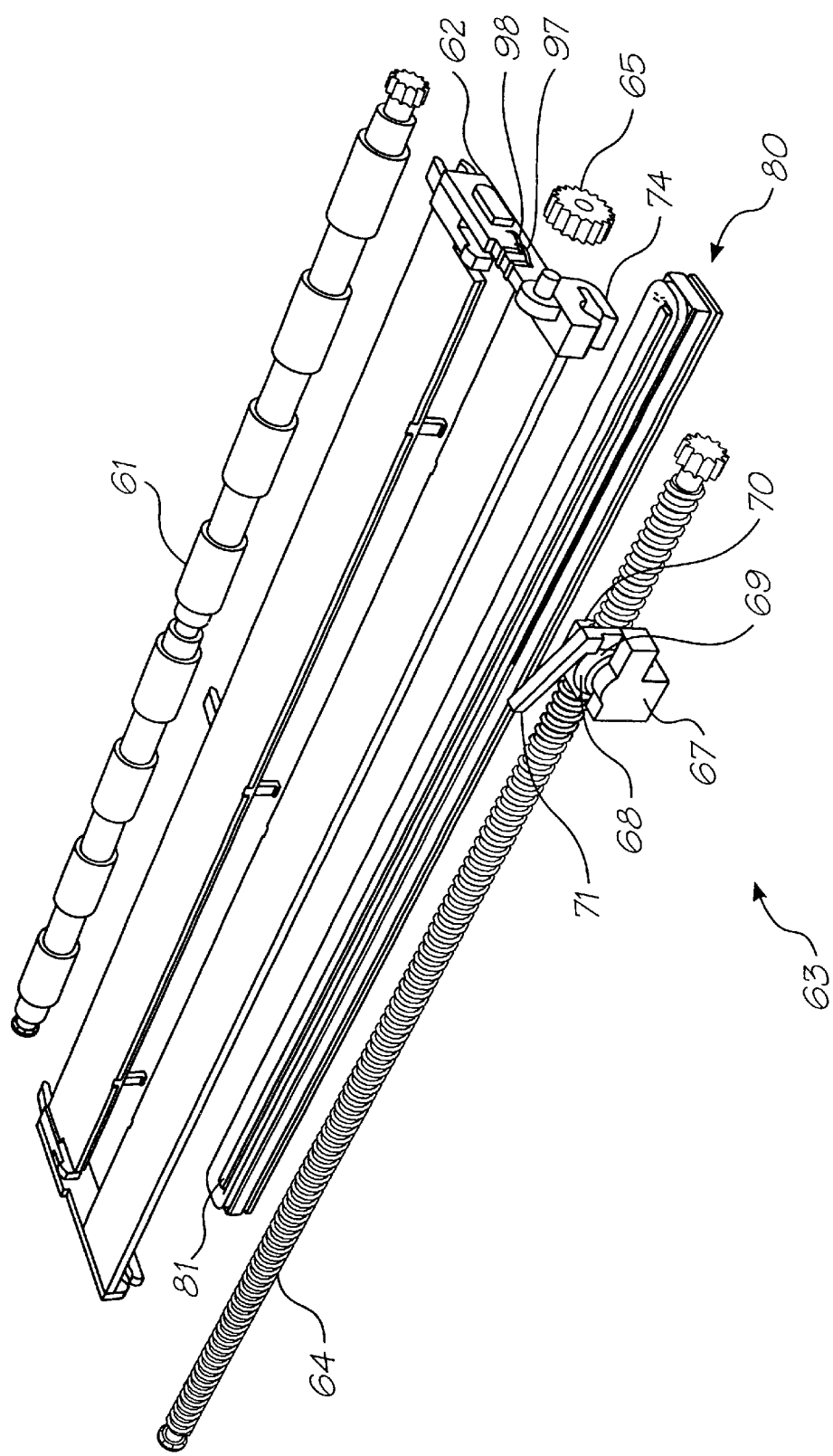
FIG. 8 is an exploded perspective view of the platten unit of the preferred embodiment.
Figure 9:
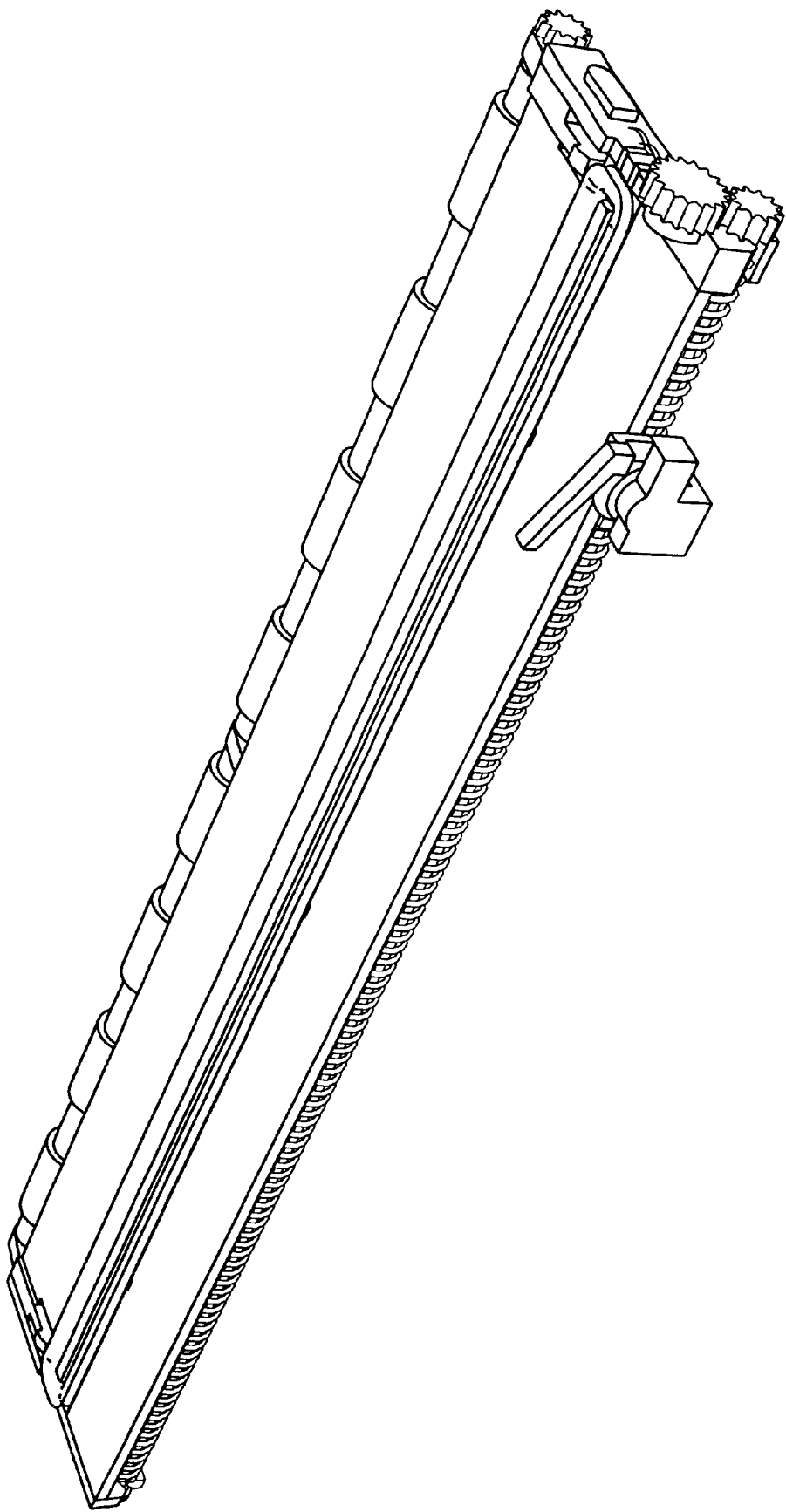
FIG. 9 is a perspective view of the assembled form of the platten unit.
Figure 10:
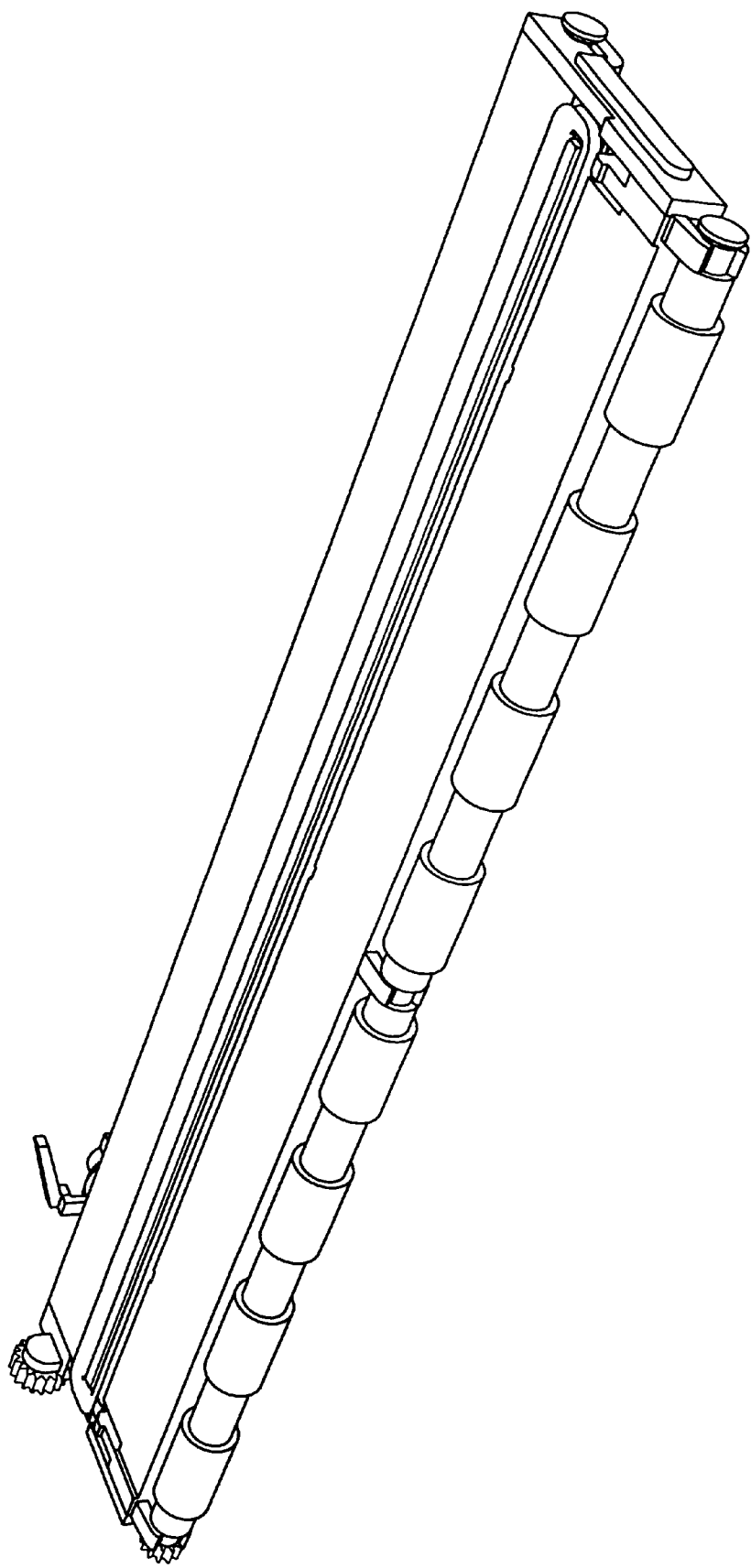
FIG. 10 is also a perspective view of the assembled form of the platten unit.

The ink supply mechanism 40 interacts with a platten unit 60 which guides print media under a printhead located in the ink supply mechanism. FIG. 8 shows an exploded view of the platten unit 60, while FIGS. 9 and 10 show assembled views of the platten unit. The platten unit 60 includes a first pinch roller 61 which is snap fitted to one side of a platten base 62. Attached to a second side of the platten base 62 is a cutting mechanism 63 which traverses the platten unit 60 by means of a rod 64 having a screw thread which is rotated by means of cogged wheel 65 which is also fitted to the platten base 62. The screw threaded rod 64 mounts engages a block 67 which includes a cutting wheel 68 fastened via a fastener 69. Also mounted to the block 67 is a counter actuator which includes a paws 71. The pawl 71 acts to rotate the dial mechanism 44 of FIG. 6 upon the return traversal of the cutting wheel. As shown previously in FIG. 6, the dial mechanism 44 includes a cogged surface which interacts with pawl 71 , thereby maintaining a count of the number of photographs by means of numbers embossed on the surface of dial mechanism 44. The cutting mechanism 63 is inserted into the platten base 62 by means of a snap fit via clips. 74.

The platten unit 60 includes an internal recapping mechanism 80 for recapping the print head when not in use. The recapping mechanism 80 includes a sponge portion 81 and is operated via a solenoid coil so as to provide for recapping of the print head. In the preferred embodiment, there is provided an inexpensive form of printhead re-capping mechanism provided for incorporation into a handheld camera system so as to provide for printhead re-capping of an inkjet printhead.

Figure 11:
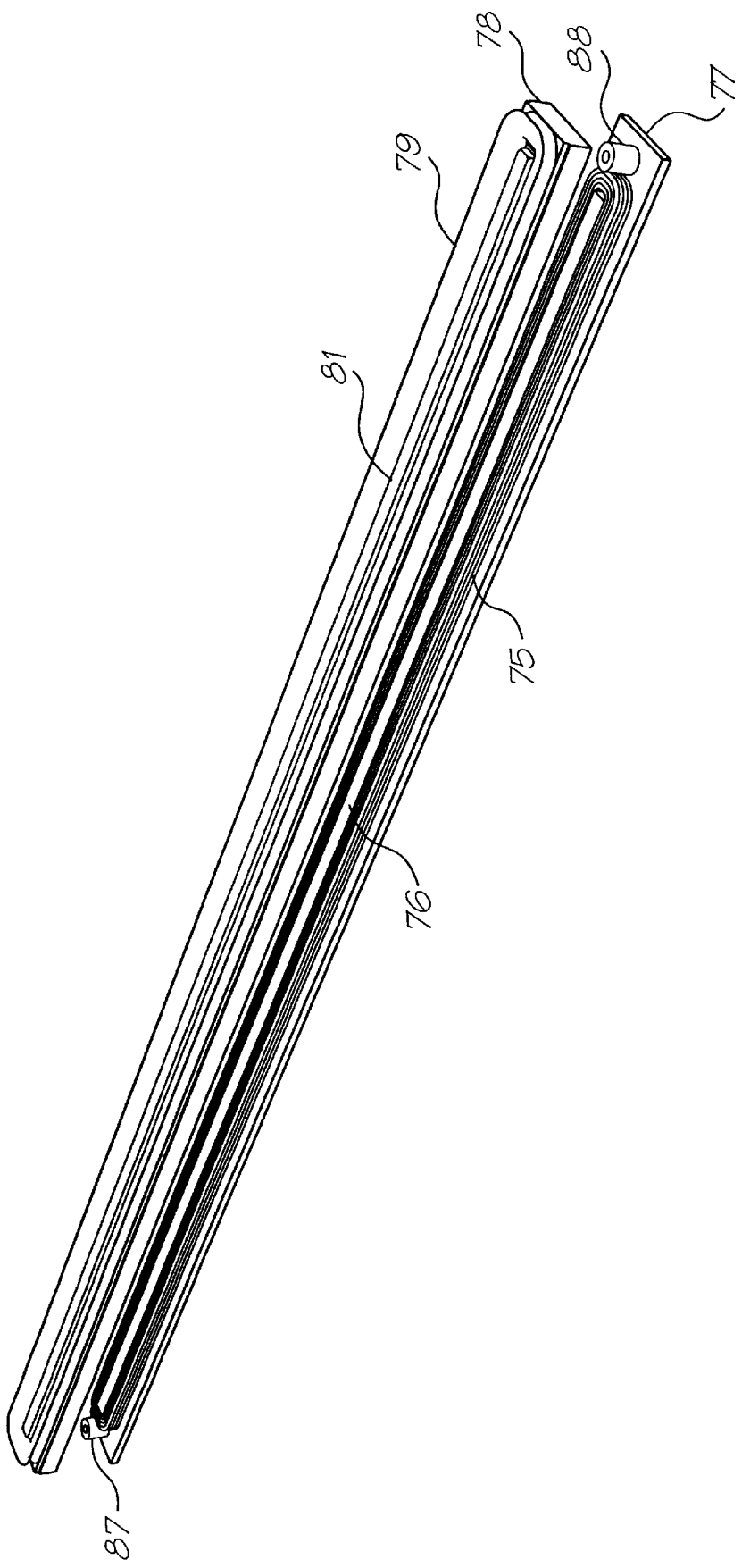
FIG. 11 is an exploded perspective view of the printhead recapping mechanism of the preferred embodiment.
Figure 12:
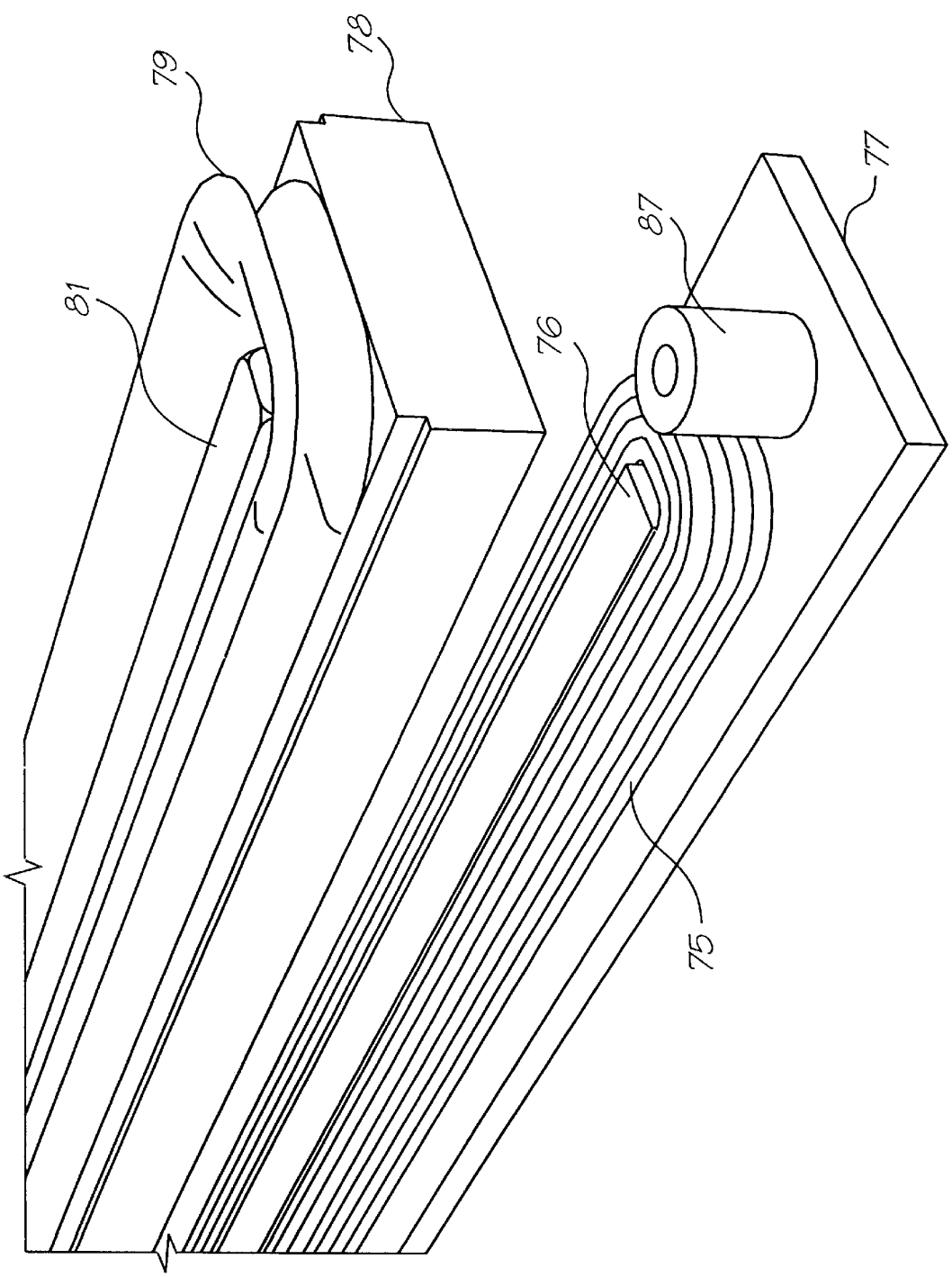
FIG. 12 is a close up exploded perspective view of the recapping mechanism of the preferred embodiment.

FIG. 11 illustrates an exploded view of the recapping mechanism whilst FIG. 12 illustrates a close up of the end portion thereof. The re-capping mechanism 80 is structured around a solenoid including a 16 turn coil 75 which can comprise insulated wire. The coil 75 is turned around a first stationery solenoid arm 76 which is mounted on a bottom surface of the platten base 62 (FIG. 8) and includes a post portion 77 to magnify effectiveness of operation. The arm 76 can comprise a ferrous material.

A second moveable arm 78 of the solenoid actuator is also provided. The arm 78 is moveable and is also made of ferrous material. Mounted on the arm is a sponge portion surrounded by an elastomer strip 79. The elastomer strip 79 is of a generally arcuate cross-section and act as a leaf spring against the surface of the printhead ink supply cartridge 42 (FIG. 5) so as to provide for a seal against the surface of the printhead ink supply cartridge 42. In the quiescent position an elastomer spring unit 87, 88 acts to resiliently deform the elastomer seal 79 against the surface of the ink supply unit 42.

When it is desired to operate the printhead unit, upon the insertion of paper, the solenoid coil 75 is activated so as to cause the arm 78 to move down to be adjacent to the end plate 76. The arm 78 is held against end plate 76 while the printhead is printing by means of a small "keeper current" in coil 75. Simulation results indicate that the keeper current can be significantly less than the actuation current. Subsequently, after photo printing, the paper is guillotined by the cutting mechanism 63 of FIG. 8 acting against Aluminium Strip 43, and rewound so as to clear the area of the re-capping mechanism 80. Subsequently, the current is turned off and springs 87, 88 return the arm 78 so that the elastomer seal is again resting against the printhead ink supply cartridge.

It can be seen that the preferred embodiment provides for a simple and inexpensive means of re-capping a printhead through the utilisation of a solenoid type device having a long rectangular form. Further, the preferred embodiment utilises minimal power in that currents are only required whilst the device is operational and additionally, only a low keeper current is required whilst the printhead is printing.

Figure 13:
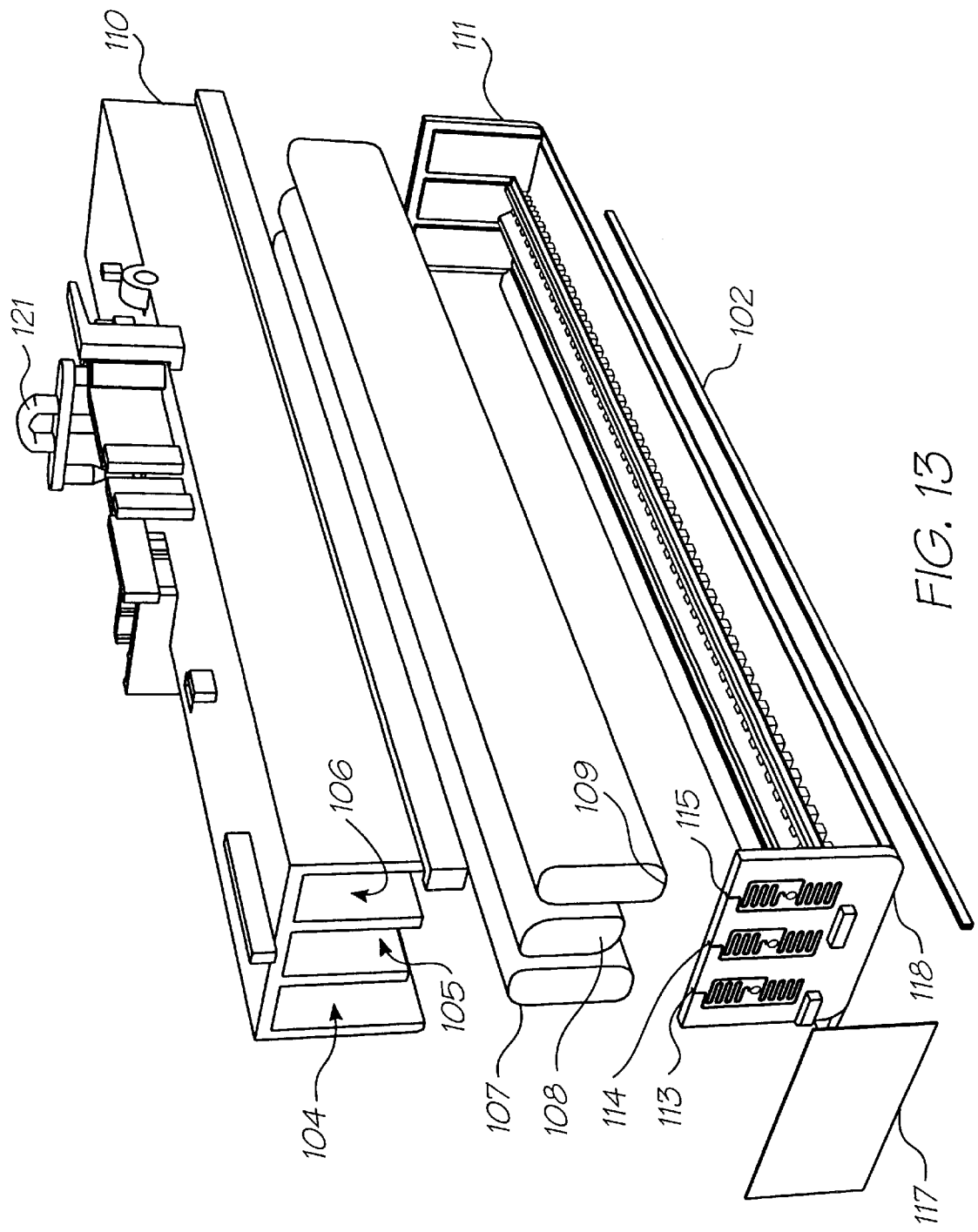
FIG. 13 is an exploded perspective view of the ink supply cartridge of the preferred embodiment.
Figure 14:
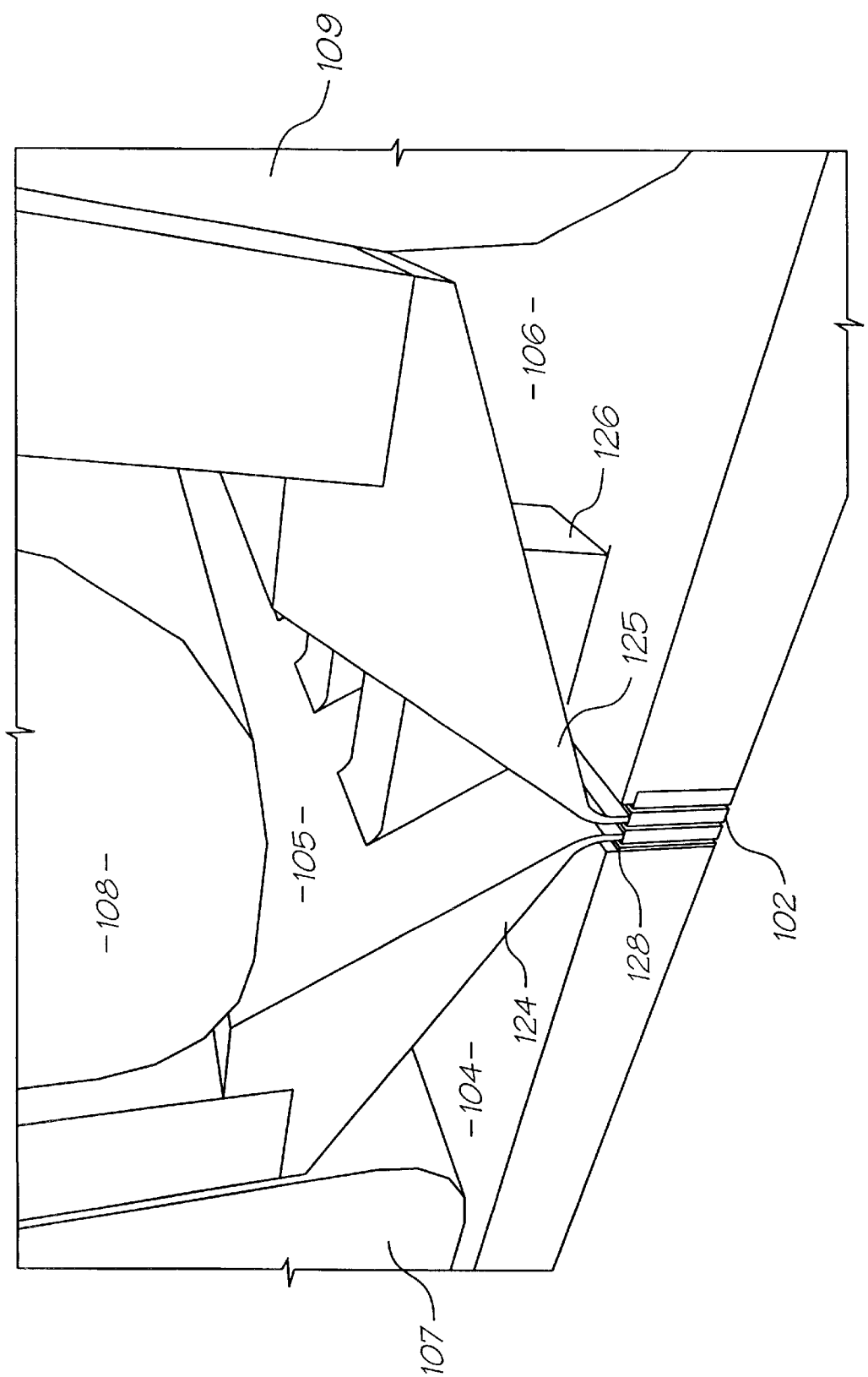
FIG. 14 is a close up perspective view, partly in section, of the internal portions of the ink supply cartridge in an assembled form.

Turning next to FIGS. 13 and 14, FIG. 13 illustrates an exploded perspective of the ink supply cartridge 42 whilst FIG. 14 illustrates a close up sectional view of a bottom of the ink supply cartridge with the printhead unit in place. The ink supply cartridge 42 is based around a pagewidth printhead 102 which comprises a long slither of silicon having a series of holes etched on the back surface for the supply of ink to a front surface of the silicon wafer for subsequent ejection via a micro electro mechanical system. The form of ejection can be many different forms such as those set out in the tables below.

Of course, many other inkjet technologies, as referred to the attached tables below, can also be utilised when constructing a printhead unit 102. The fundamental requirement of the ink supply cartridge 42 is the supply of ink to a series of colour channels etched through the back surface of the printhead 102. In the description of the preferred embodiment, it is assumed that a three colour printing process is to be utilised so as to provide full colour picture output. Hence, the print supply unit includes three ink supply reservoirs being a cyan reservoir 104, a magenta reservoir 105 and a yellow reservoir 106. Each of these reservoirs is required to store ink and includes a corresponding sponge type material 107–109 which assists in stabilising ink within the corresponding ink channel and inhibiting the ink from sloshing back and forth when the printhead is utilised in a handheld camera system. The reservoirs 104, 105, 106 are formed through the mating of first exterior plastic piece 110 and a second base piece 111.

At a first end 118 of the base piece 111 a series of air inlet 113–115 are provided. Each air inlet leads to a corresponding winding channel which is hydrophobically treated so as to act as an ink repellent and therefore repel any ink that may flow along the air inlet channel. The air inlet channel further takes a convoluted path assisting in resisting any ink flow out of the chambers 104–106. An adhesive tape portion 117 is provided for sealing the channels within end portion 118.

At the top end, there is included a series of refill holes (not shown) for refilling corresponding ink supply chambers 104, 105, 106. A plug 121 is provided for sealing the refill holes.

Turning now to FIG. 14, there is illustrated a close up perspective view, partly in section through the ink supply cartridge 42 of FIG. 13 when formed as a unit. The ink supply cartridge includes the three colour ink reservoirs 104, 105, 106 which supply ink to different portions of the back surface of printhead 102 which includes a series of apertures 128 defined therein for carriage of the ink to the front surface.

The ink supply cartridge 42 includes two guide walls 124, 125 which separate the various ink chambers and are tapered into an end portion abutting the surface of the printhead 102. The guide walls 124, 125 are further mechanically supported by block portions eg. 126 which are placed at regular intervals along the length of the ink supply unit. The block portions 126 leave space at portions close to the back of printhead 102 for the flow of ink around the back surface thereof.

The ink supply unit is preferably formed from a multi-part plastic injection mould and the mould pieces eg. 110, 111 (FIG. 13) snap together around the sponge pieces 107, 109. Subsequently, a syringe type device can be inserted in the ink refill holes and the ink reservoirs filled with ink with the air flowing out of the air outlets 113–115. Subsequently, the adhesive tape portion 117 and plug 121 are attached and the printhead tested for operation capabilities. Subsequently, the ink supply cartridge 42 can be readily removed for refilling by means of removing the ink supply cartridge, performing a washing cycle, and then utilising the holes for the insertion of a refill syringe filled with ink for refilling the ink chamber before returning the ink supply cartridge 42 to a camera.

Figure 15:
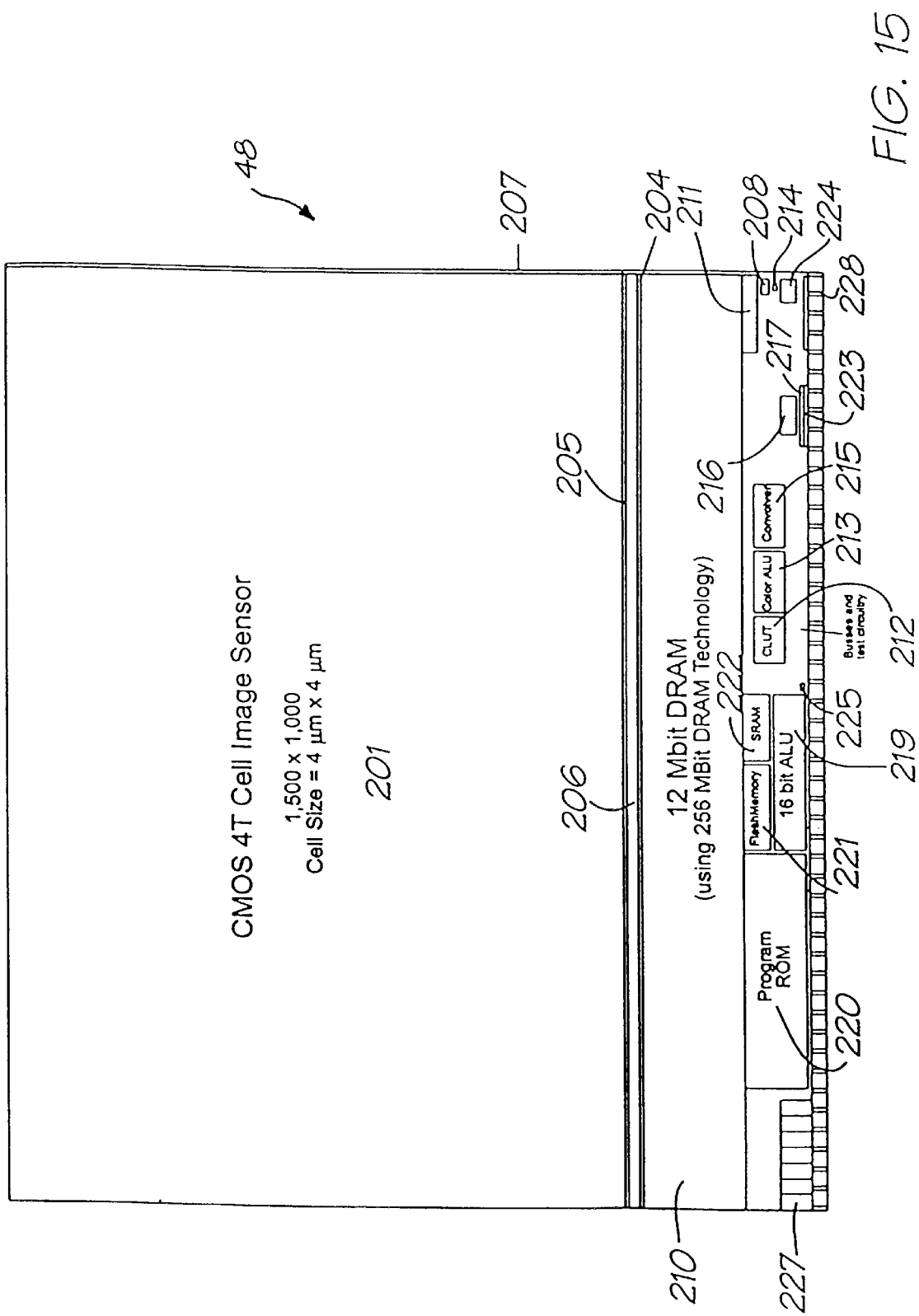
FIG. 15 is a schematic block diagram of one form of chip layer of the image capture and processing chip of the preferred embodiment.

Turning now to FIG. 15, there is shown an example layout of the Image Capture and Processing Chip (ICP) 48. The Image Capture and Processing Chip 48 provides most of the electronic functionality of the camera with the exception of the print head chip. The chip 48 is a highly integrated system. It combines CMOS image sensing, analog to digital conversion, digital image processing, DRAM storage, ROM, and miscellaneous control functions in a single chip.

The chip is estimated to be around 32 $mm^2$ using a leading edge 0.18 micron CMOS/DRAM/APS process. The chip size and cost can scale somewhat with Moore's law, but is dominated by a CMOS active pixel sensor array 201, so scaling is limited as the sensor pixels approach the diffraction limit.

The ICP 48 includes CMOS logic, a CMOS image sensor, DRAM, and analog circuitry. A very small amount of flash memory or other non-volatile memory is also preferably included for protection against reverse engineering.

Alternatively, the ICP can readily be divided into two chips: one for the CMOS imaging array, and the other for the remaining circuitry. The cost of this two chip solution should not be significantly different than the single chip ICP, as the extra cost of packaging and bond-pad area is somewhat cancelled by the reduced total wafer area requiring the color filter fabrication steps. The ICP preferably contains the following functions:

| Function |
| --- |
| 1.5 megapixel image sensor |
| Analog Signal Processors |
| Function |
| Image sensor column decoders |
| Image sensor row decoders |
| Analogue to Digital Conversion (ADC) |
| Column ADC's |
| Auto exposure |
| 12 Mbits of DRAM |
| DRAM Address Generator |
| Color interpolator |
| Convolver |
| Color ALU |
| Halftone matrix ROM |
| Digital halftoning |
| Print head interface |
| 8 bit CPU core |
| Program ROM |
| Flash memory |
| Scratchpad SRAM |
| Parallel interface (8 bit) |
| Motor drive transistors (5) |
| Clock PLL |
| JTAG test interface |
| Test circuits |
| Busses |
| Bond pads |

The CPU, DRAM, Image sensor, ROM, Flash memory, Parallel interface, JTAG interface and ADC can be vendor supplied cores. The ICP is intended to run on 1.5V to minimize power consumption and allow convenient operation from two AA type battery cells.

FIG. 15 illustrates a layout of the ICP 48. The ICP 48 is dominated by the imaging array 201, which consumes around 80% of the chip area The imaging array is a CMOS 4 transistor active pixel design with a resolution of 1,500×1,000. The array can be divided into the conventional configuration, with two green pixels, one red pixel, and one blue pixel in each pixel group. There are 750×500 pixel groups in the imaging array.

The latest advances in the field of image sensing and CMOS image sensing in particular can be found in the October, 1997 issue of TV Transactions on Electron Devices and, in particular, pages 1689 to 1968. Further, a specific implementation similar to that disclosed in the present application is disclosed in Wong et. al, "CMOS Active Pixel Image Sensors Fabricated Using a 1.8V, 0.25 $\mu$m CMOS Technology", IEDM 1996, page 915.

The imaging array uses a 4 transistor active pixel design of a standard configuration. To minimize chip area and therefore cost, the image sensor pixels should be as small as feasible with the technology available. With a four transistor cell, the typical pixel size scales as 20 times the lithographic feature size. This allows a minimum pixel area of around 3.6 $\mu$m×3.6 $\mu$m. However, the photosite must be substantially above the diffraction limit of the lens. It is also advantageous to have a square photosite, to maximize the margin over the diffraction limit in both horizontal and vertical directions. In this case, the photosite can be specified as 2.5 $\mu$m×2.5 $\mu$m. The photosite can be a photogate, pinned photodiode, charge modulation device, or other sensor.

The four transistors are packed as an 'L' shape, rather than a rectangular region, to allow both the pixel and the photosite to be square. This reduces the transistor packing density slightly, increasing pixel size. However, the advantage in avoiding the diffraction limit is greater than the small decrease in packing density.

The transistors also have a gate length which is longer than the minimum for the process technology. These have been increased from a drawn length of 0.18 micron to a drawn length of 0.36 micron. This is to improve the transistor matching by making the variations in gate length represent a smaller proportion of the total gate length.

The extra gate length, and the 'L' shaped packing, mean that the transistors use more area than the minimum for the technology. Normally, around 8 $\mu m^2$ would be required for rectangular packing. Preferably, 9.75 $\mu m^2$ has been allowed for the transistors.

The total area for each pixel is 16 $\mu m^2$, resulting from a pixel size of 4$\mu$m×4 $\mu$m. With a resolution of 1,500×1,000, the area of the imaging array 101 is 6,000 $\mu$m×4,000 $\mu$m, or 24 $mm^2$.

The presence of a color image sensor on the chip affects the process required in two major ways:

The CMOS fabrication process should be optimized to minimize dark current Color filters are required. These can be fabricated using dyed photosensitive polyimides, resulting in an added process complexity of three spin coatings, three photolithographic steps, development steps, and three hardbakes.

There are 15,000 analog signal processors (ASPs) 205, one for each of the columns of the sensor. The ASPs amplify the signal, provide a dark current reference, sample and hold the signal, and suppress the fixed pattern noise (FPN).

There are 375 analog to digital converters 206, one for each four columns of the sensor array. These may be delta-sigma or successive approximation type ADC's. A row of low column ADC's are used to reduce the conversion speed required, and the amount of analog signal degradation incurred before the signal is converted to digital. This also eliminates the hot spot (affecting local dark current) and the substrate coupled noise that would occur if a single high speed ADC was used. Each ADC also has two four bit DAC's which trim the offset and scale of the ADC to further reduce FPN variations between columns. These DAC's are controlled by data stored in flash memory during chip testing.

The column select logic 204 is a 1:1500 decoder which enables the appropriate digital output of the ADCs onto the output bus. As each ADC is shared by four columns, the least significant two bits of the row select control 4 input analog multiplexors.

A row decoder 207 is a 1:1000 decoder which enables the appropriate row of the active pixel sensor array. This selects which of the 1000 rows of the imaging array is connected to analog signal processors. As the rows are always accessed in sequence, the row select logic can be implemented as a shift register.

An auto exposure system 208 adjusts the reference voltage of the ADC 205 in response to the maximum intensity sensed during the previous frame period. Data from the green pixels is passed through a digital peak detector. The peak value of the image frame period before capture (the reference frame) is provided to a digital to analogue converter (DAC), which generates the global reference voltage for the column ADCs. The peak detector is reset at the beginning of the reference frame. The minimum and maximum values of the three RGB color components are also collected for color correction.

The second largest section of the chip is consumed by a DRAM 210 used to hold the image. To store the 1,500×1,000 image from the sensor without compression, 1.5 Mbytes of DRAM 210 are required. This equals 12 Mbits, or slightly less than 5% of a 256 Mbit DRAM. The DRAM technology assumed is of the 256 Mbit generation implemented using 0.18 $\mu$m CMOS.

Using a standard 8 F cell, the area taken by the memory array is 3.11 mm$^2$. When row decoders, column sensors, redundancy, and other factors are taken into account, the DRAM requires around 4 mm$^2$.

This DRAM 210 can be mostly eliminated if analog storage of the image signal can be accurately maintained in the CMOS imaging array for the two seconds required to print the photo. However, digital storage of the image is preferable as it is maintained without degradation, is insensitive to noise, and allows copies of the photo to be printed considerably later.

A DRAM address generator 211 provides the write and read addresses to the DRAM 210. Under normal operation, the write address is determined by the order of the data read from the CMOS image sensor 201. This will typically be a simple raster format. However, the data can be read from the sensor 201 in any order, if matching write addresses to the DRAM are generated. The read order from the DRAM 210 will normally simply match the requirements of a color interpolator and the print head. As the cyan, magenta, and yellow rows of the print head are necessarily offset by a few pixels to allow space for nozzle actuators, the colors are not read from the DRAM simultaneously. However, there is plenty of time to read all of the data from the DRAM many times during the printing process. This capability is used to eliminate the need for FIFOs in the print head interface, thereby saving chip area. All three RGB image components can be read from the DRAM each time color data is required. This allows a color space converter to provide a more sophisticated conversion than a simple linear RGB to CMY conversion.

Also, to allow two dimensional filtering of the image data without requiring line buffers, data is re-read from the DRAM array.

The address generator may also implement image effects in certain models of camera. For example, passport photos are generated by a manipulation of the read addresses to the DRAM. Also, image framing effects (where the central image is reduced), image warps, and kaleidoscopic effects can all be generated by manipulating the read addresses of the DRAM.

While the address generator 211 may be implemented with substantial complexity if effects are built into the standard chip, the chip area required for the address generator is small, as it consists only of address counters and a moderate amount of random logic.

A color interpolator 214 converts the interleaved pattern of red, 2×green, and blue pixels into RGB pixels. It consists of three 8 bit adders and associated registers. The divisions are by either 2 (for green) or 4 (for red and blue) so they can be implemented as fixed shifts in the output connections of the adders.

A convolver 215 is provided as a sharpening filter which applies a small convolution kernel (5 ×5) to the red, green, and blue planes of the image. The convolution kernel for the green plane is, different from that of the red and blue planes, as green has twice as many samples. The sharpening filter has five functions:

To improve the color interpolation from the linear interpolation provided by the color interpolator, to a close approximation of a sinc interpolation.

To compensate for the image 'softening' which occurs during digitization.

To adjust the image sharpness to match average consumer preferences, which are typically for the image to be slightly sharper than reality. As the single use camera is intended as a consumer product, and not a professional photographic products, the processing can match the most popular settings, rather than the most accurate.

To suppress the sharpening of high frequency (individual pixel) noise. The function is similar to the 'unsharp mask' process.

To antialias Image Warping.

These functions are all combined into a single convolution matrix. As the pixel rate is low (less than 1 Mpixel per second) the total number of multiplies required for the three color channels is 56 million multiplies per second. This can be provided by a single multiplier. Fifty bytes of coefficient ROM are also required.

A color ALU 113 combines the functions of color compensation and color space conversion into the one matrix multiplication, which is applied to every pixel of the frame. As with sharpening, the color correction should match the most popular settings, rather than the most accurate.

A color compensation circuit of the color ALU provides compensation for the lighting of the photo. The vast majority of photographs are substantially improved by a simple color compensation, which independently normalizes the contrast and brightness of the three color components.

A color look-up table (CLUT) 212 is provided for each color component. These are three separate 256×8 SRAMs, requiring a total of 6,144 bits. The CLUTs are used as part of the color correction process. They are also used for color special effects, such as stochastically selected "wild color" effects.

A color space conversion system of the color ALU converts from the RGB color space of the image sensor to the CMY color space of the printer. The simplest conversion is a 1's complement of the RGB data. However, this simple conversion assumes perfect linearity of both color spaces, and perfect dye spectra for both the color filters of the image sensor, and the ink dyes. At the other extreme is a tri-linear interpolation of a sampled three dimensional arbitrary transform table. This can effectively match any non-linearity or differences in either color space. Such a system is usually necessary to obtain good color space conversion when the print engine is a color electrophotographic However, since the non-linearity of a halftoned ink jet output is very small, a simpler system can be used. A simple matrix multiply can provide excellent results. This requires nine multiplies and six additions per contone pixel. However, since the contone pixel rate is low (less than 1 Mpixel/sec) these operations can share a single multiplier and adder. The multiplier and adder are used in a color ALU which is shared with the color compensation function.

Digital halftoning can be performed as a dispersed dot ordered dither using a stochastic optiized dither cell. A halftone matrix ROM 216 is provided for storing dither cell coefficients. A dither cell size of 32×32 is adequate to ensure that the cell repeat cycle is not visible. The three colors—cyan, magenta, and yellow—are all dithered using the same cell, to ensure maximum co-positioning of the ink dots. This minimizes 'muddying' of the mid-tones which results from bleed of dyes from one dot to adjacent dots while still wet The total ROM size required is 1 KByte, as the one ROM is shared by the halftoning units for each of the three colors.

The digital halftoning used is dispersed dot ordered dither with stochastic optimized dither matrix. While dithering does not produce an image quite as 'sharp' as error diffusion, it does produce a more accurate image with fewer artifacts. The image sharpening produced by error diffusion is artificial, and less controllable and accurate than 'unsharp mask' filtering performed in the contone domain. The high print resolution (1,600 dpi×1,600 dpi) results in excellent quality when using a well formed stochastic dither matrix.

Digital halftoning is performed by a digital halftoning unit 217 using a simple comparison between the contone information from the DRAM 210 and the contents of the dither matrix 216. During the halftone process, the resolution of the image is changed from the 250 dpi of the captured contone image to the 1,600 dpi of the printed image. Each contone pixel is converted to an average of 40.96 halftone dots.

The ICP incorporates a 16 bit microcontroller CPU core 219 to run the miscellaneous camera functions, such as reading the buttons, controlling the motor and solenoids, setting up the hardware, and authenticating the refill station. The processing power required by the CPU is very modest, and a wide variety of processor cores can be used. As the entire CPU program is run from a small ROM 220, program compatibility between camera versions is not important, as no external programs are run. A 2 Mbit (256 Kbyte) program and data ROM 220 is included on chip. Most of this ROM space is allocated to data for outline graphics and fonts for specialty cameras. The program requirements are minor. The single most complex task is the encrypted authentication of the refill station. The ROM requires a single transistor per bit.

A Flash memory 221 may be used to store a 128 bit authentication code. This provides higher security than storage of the authentication code in ROM, as reverse engineering can be made essentially impossible. The Flash memory is completely covered by third level metal, making the data impossible to extract using scanning probe microscopes or electron beams. The authentication code is stored in the chip when manufactured. At least two other Flash bits are required for the authentication process: a bit which locks out reprogramming of the authentication code, and a bit which indicates that the camera has been refilled by an authenticated refill station. The flash memory can also be used to store FPN correction data for the imaging array. Additionally, a phase locked loop rescaling parameter is stored for scaling the clocking cycle to an appropriate correct time. The clock frequency does not require crystal accuracy since no date functions are provided. To eliminate the cost of a crystal, an on chip oscillator with a phase locked loop 224 is used. As the frequency of an on-chip oscillator is highly variable from chip to chip, the frequency ratio of the oscillator to the PLL is digitally trimmed during initial testing. The value is stored in Flash memory 221. This allows the clock PLL to control the ink-jet heater pulse width with sufficient accuracy.

A scratchpad SRAM is a small static RAM 222 with a 6T cell. The scratchpad provided temporary memory for the 16 bit CPU. 1024 bytes is adequate.

A print head interface 223 formats the data correctly for the print head. The print head interface also provides all of the timing signals required by the print head. These timing signals may vary depending upon temperature, the number of dots printed simultaneously, the print medium in the print roll, and the dye density of the ink in the print roll.

The following is a table of external connections to the print head interface:

| Connection | Function | Pins |
| --- | --- | --- |
| DataBits[0–7] | Independent serial data to the eight segments of the print head | 8 |
| BitClock | Main data clock for the print head | 1 |
| ColorEnable[0–2] | Independent enable signals for the CMY actuators, allowing different pulse times for each color. | 3 |
| BankEnable[0–1] | Allows either simultaneous or interleaved actuation of two banks of nozzles. This allows two different print speed/power consumption tradeoffs | 2 |
| NozzleSelect[0–4] | Selects one of 32 banks of nozzles for simultaneous actuation | 5 |
| ParallelXferClock | Loads the parallel transfer register with the data from the shift registers | 1 |
| Total | | 20 |

The print head utilized is composed of eight identical segments, each 1.25 cm long. There is no connection between the segments on the print head chip. Any connections required are made in the external TAB bonding film, which is double sided. The division into eight identical segments is to simplify lithography using wafer steppers. The segment width of 1.25 cm fits easily into a stepper field. As the print head chip is long and narrow (10 cm×03 mm), the stepper field contains a single segment of 32 print head chips. The stepper field is therefore 1.25 cm×1.6 cm. An average of four complete print heads are patterned in each wafer step.

A single BitClock output line connects to all 8 segments on the print head. The 8 DataBits lines lead one to each segment, and are clocked into the 8 segments on the print head simultaneously (on a BitClock pulse). For example, dot 0 is transferred to segment$_0$, dot 750 is transferred to segment$_1$, dot 1500 to segment$_2$ etc simultaneously.

The ParallelXferClock is connected to each of the 8 segments on the print head, so that on a single pulse, all segments transfer their bits at the same time.

The NozzleSelect, BankEnable and ColorEnable lines are connected to each of the 8 segments, allowing the print head interface to independently control the duration of the cyan, magenta, and yellow nozzle energizing pulses. Registers in the Print Head Interface allow the accurate specification of the pulse duration between 0 and 6 ms, with a typical duration of 2 ms to 3 ms.

A parallel interface 125 connects the ICP to individual static electrical signals. The CPU is able to control each of these connections as memory mapped I/O via a low speed bus.

The following is a table of connections to the parallel interface:

| Connection | Direction | Pins |
|---|---|---|
| Paper transport stepper motor | Output | 4 |
| Capping solenoid | Output | 1 |
| Copy LED | Output | 1 |
| Photo button | Input | 1 |
| Copy button | Input | 1 |
| Total | | 8 |

Seven high current drive transistors eg. 227 are required. Four are for the four phases of the main stepper motor, two are for the guillotine motor, and the remaining transistor is to drive the capping solenoid. These transistors are allocated 20,000 square microns (600,000 F) each. As the transistors are driving highly inductive loads, they must either be turned off slowly, or be provided with a high level of back EMF protection. If adequate back EMF protection cannot be provided using the chip process chosen, then external discrete transistors should be used. The transistors are never driven at the same time as the image sensor is used. This is to avoid voltage fluctuations and hot spots affecting the image quality. Further, the transistors are located as far away from the sensor as possible.

A standard JTAG (Joint Test Action Group) interface 228 is included in the ICP for testing purposes and for interrogation by the refill station. Due to the complexity of the chip, a variety of testing techniques are required, including BIST (Built In Self Test) and functional block isolation. An overhead of 10% in chip area is assumed for chip testing circuitry for the random logic portions. The overhead for the large arrays the image sensor and the DRAM is smaller.

The JTAG interface is also used for authentication of the refill station. This is included to ensure that the cameras are only refilled with quality paper and ink at a properly constructed refill station, thus preventing inferior quality refills from occurring. The camera must authenticate the refill station, rather than vice versa. The secure protocol is communicated to the refill station during the automated test procedure. Contact is made to four gold plated spots on the ICP/print head TAB by the refill station as the new ink is injected into the print head.

Figure 16:
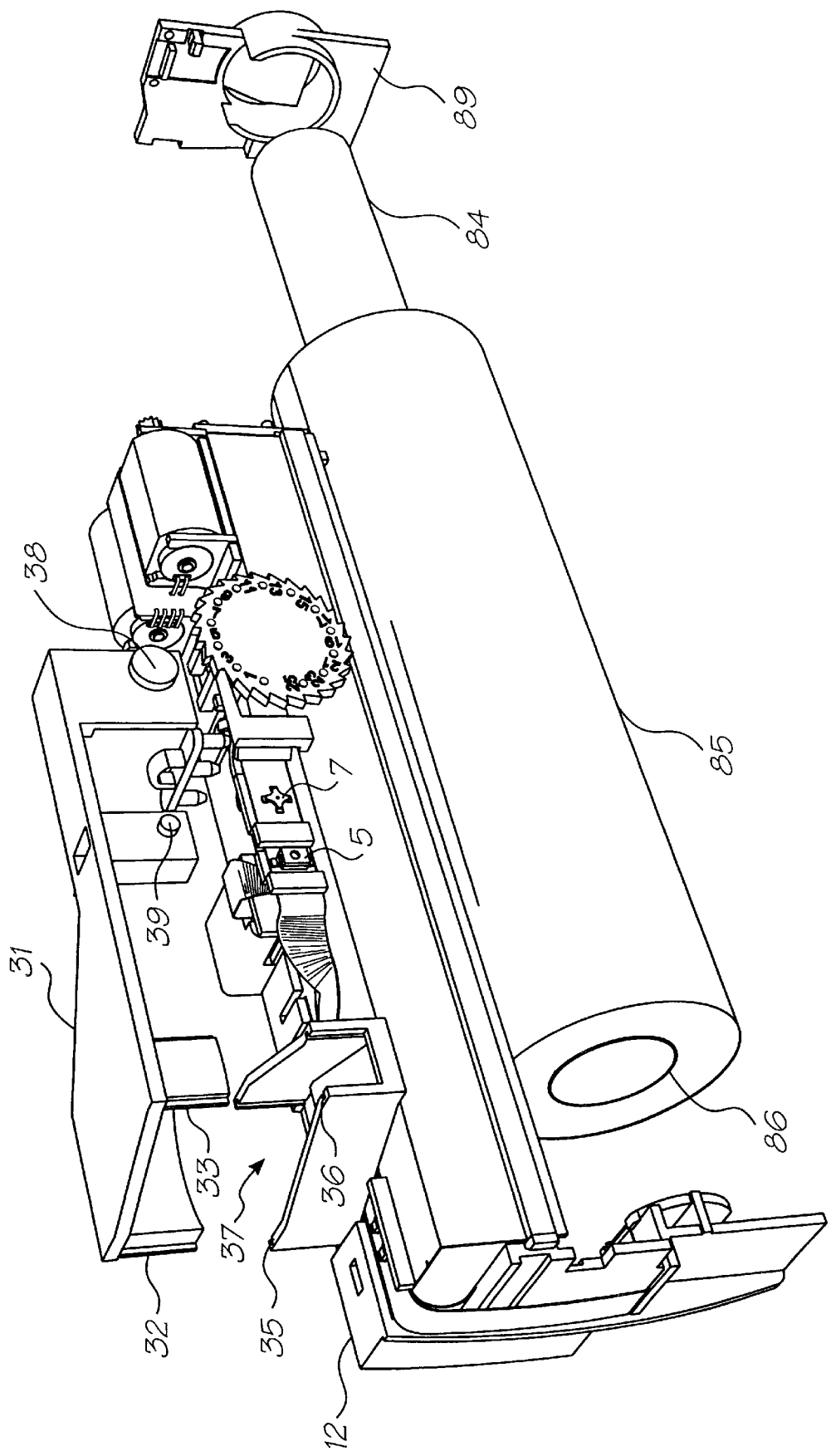
FIG. 16 is an exploded perspective view illustrating the assembly process of the preferred embodiment.
Figure 17:
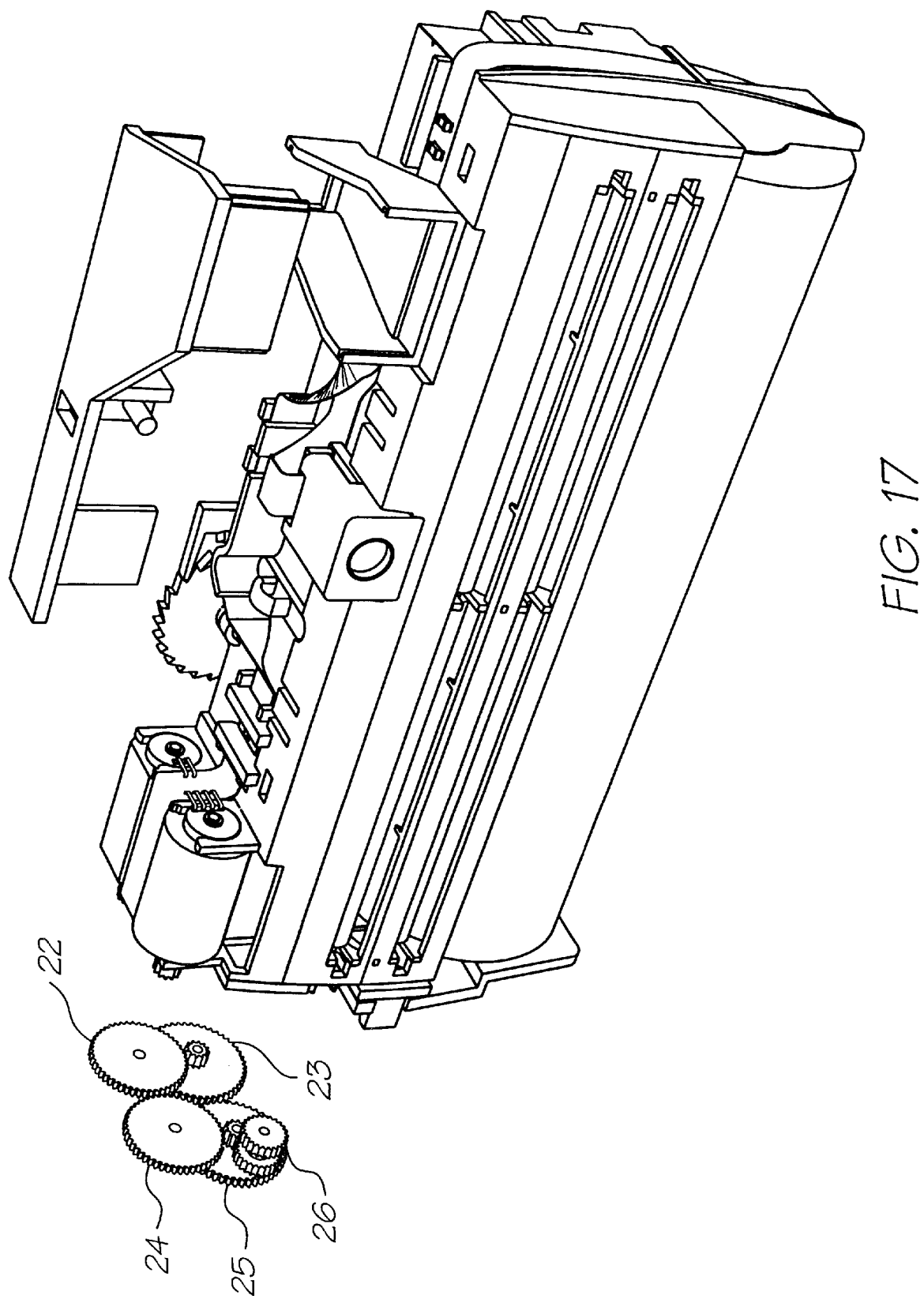
FIG. 17 illustrates a front exploded perspective view of the assembly process of the preferred embodiment.

FIG. 16 illustrates a rear view of the next step in the construction process whilst FIG. 17 illustrates a front view.

Turning now to FIG. 16, the assembly of the camera system proceeds via first assembling the ink supply mechanism 40. The flex PCB is interconnected with batteries 84, only one of which is shown, which are inserted in the middle portion of a print roll 85 which is wrapped around a plastic former 86. An end cap 89 is provided at the other end of the print roll 85 so as to fasten the print roll and batteries firmly to the ink supply mechanism.

The solenoid coil is interconnected (not shown) to interconnects 97, 98 (FIG. 8) which include leaf spring ends for interconnection with electrical contacts on the Flex PCB so as to provide for electrical control of the solenoid.

Figure 18:
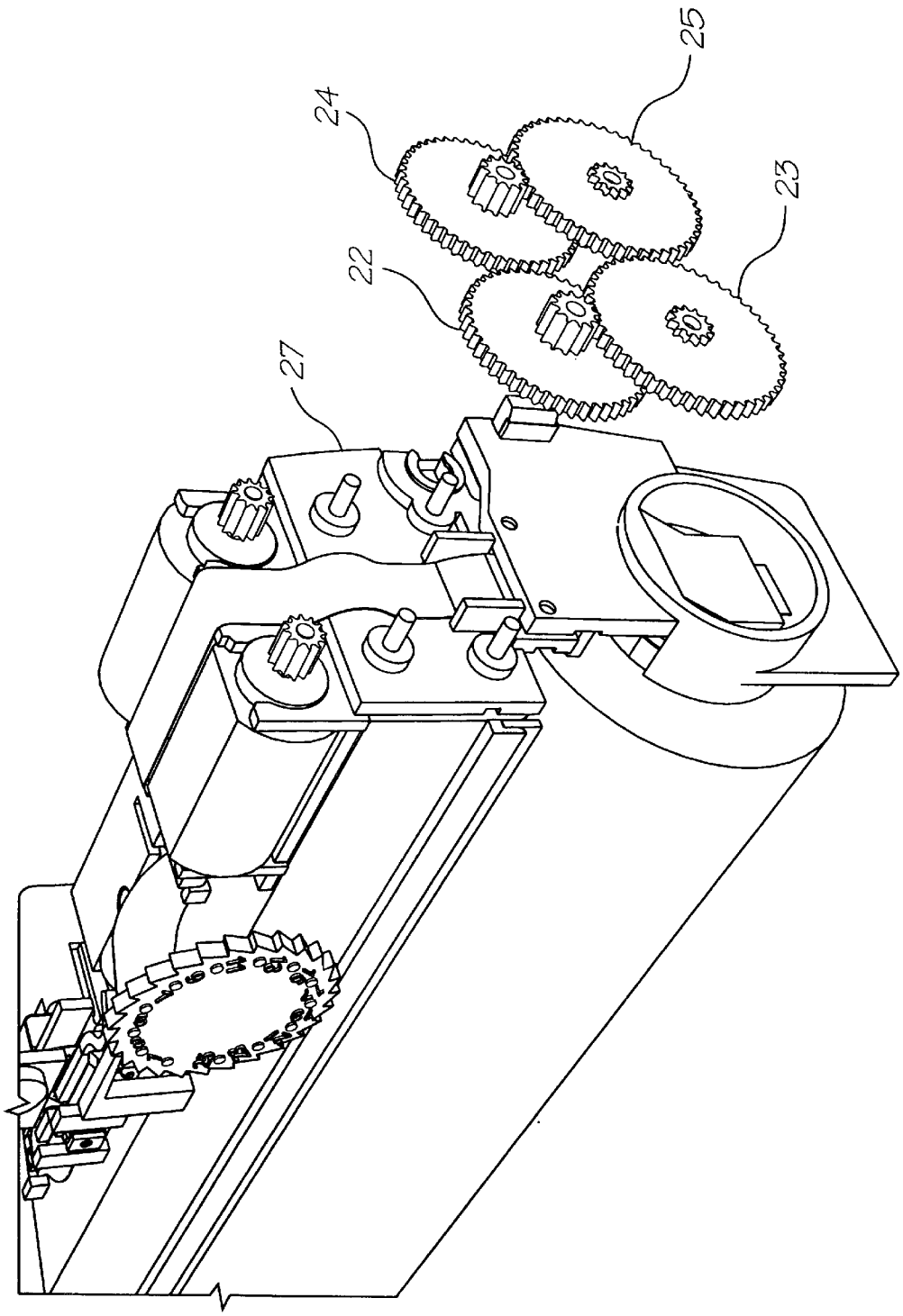
FIG. 18 illustrates a perspective view of the assembly process of the preferred embodiment.
Figure 19:
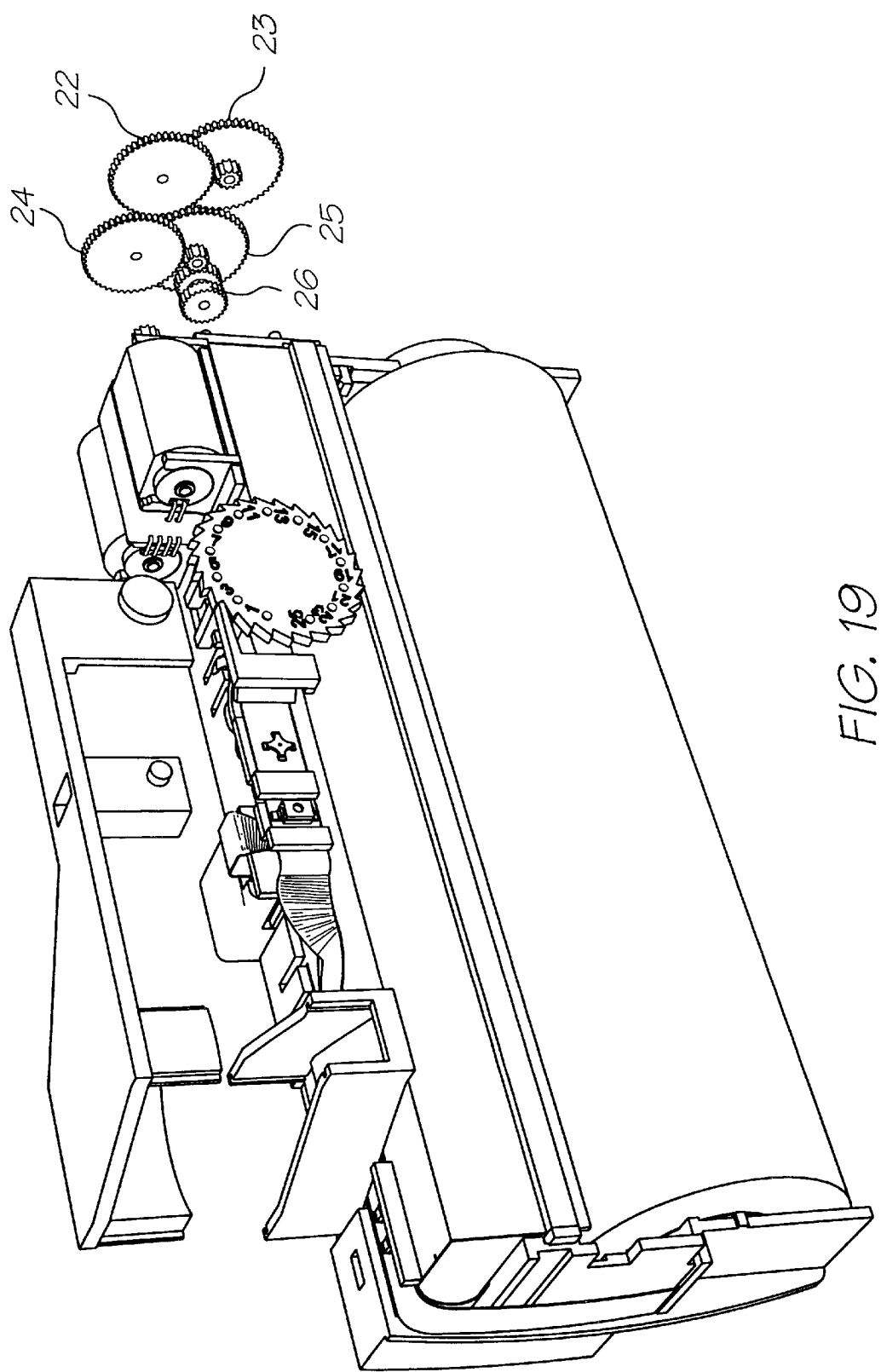
FIG. 19 illustrates a perspective view of the assembly process of the preferred embodiment.

Turning now to FIGS. 17–19 the next step in the construction process is the insertion of the relevant gear trains into the side of the camera chassis. FIG. 17 illustrates a front view, FIG. 18 illustrates a rear view and FIG. 19 also illustrates a rear view. The first gear train comprising gear wheels 22, 23 is utilised for driving the guillotine blade with the gear wheel 23 engaging the gear wheel 65 of FIG. 8. The second gear train, comprising gear wheels 24, 25 and 26 engage one end of the print roller 61 of FIG. 8. As best indicated in FIG. 18, the gear wheels mate with corresponding pins on the surface of the chassis with the gear wheel 26 being snap fitted into corresponding mating hole 27.

Figure 20:
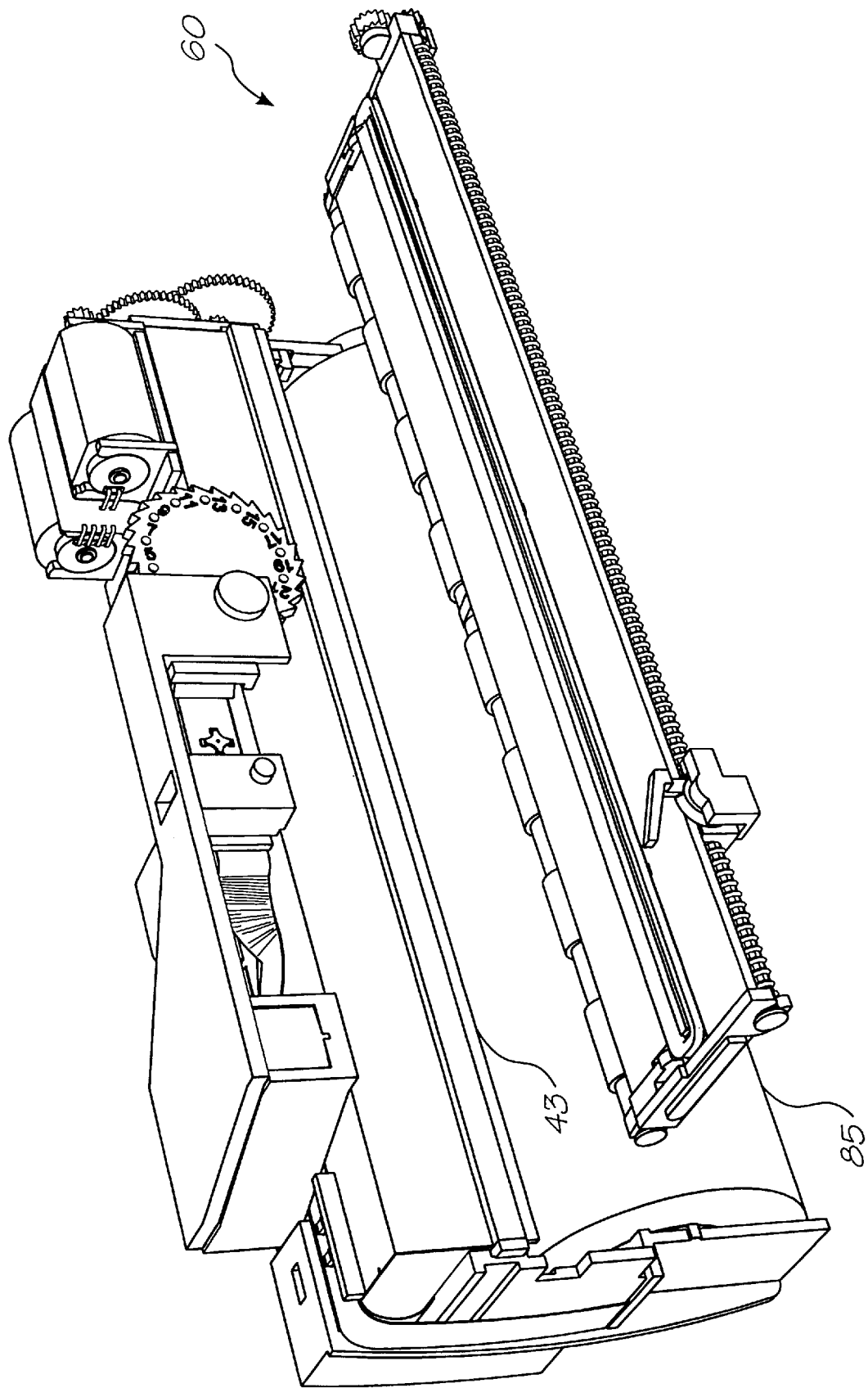
FIG. 20 is a perspective view illustrating the insertion of the platten unit in the preferred embodiment.

Next, as illustrated in FIG. 20, the assembled platten unit 60 is then inserted between the print roll 85 and aluminium cutting blade 43.

Figure 21:
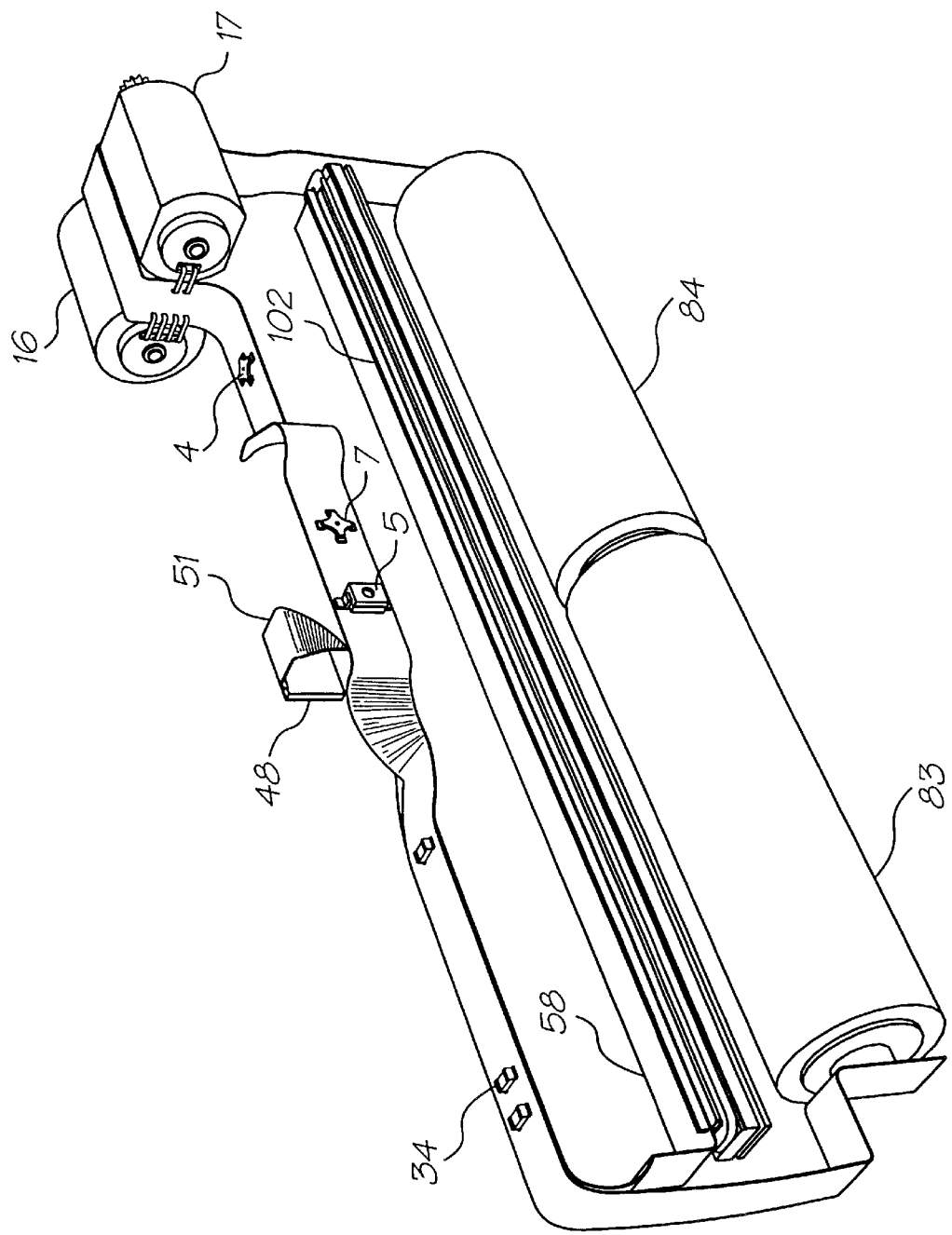
FIG. 21 illustrates the interconnection of the electrical components of the preferred embodiment.

Turning now to FIG. 21, by way of illumination, there is illustrated the electrically interactive components of the camera system. As noted previously, the components are based around a Flex PCB board and include a TAB film 58 which interconnects the printhead 102 with the image sensor and processing chip 48. Power is supplied by two AA type batteries 83, 84 and a paper drive stepper motor 16 is provided in addition to a rotary guillotine motor 17.

An optical element 31 is provided for snapping into a top portion of the chassis 12. The optical element 31 includes portions defining an optical view finder 32, 33 which are slotted into mating portions 35, 36 in view finder channel 37. Also provided in the optical element 31 is a lensing system 38 for magnification of the prints left number in addition to an optical pipe element 39 for piping light from the LED 5 for external display.

Figure 22:
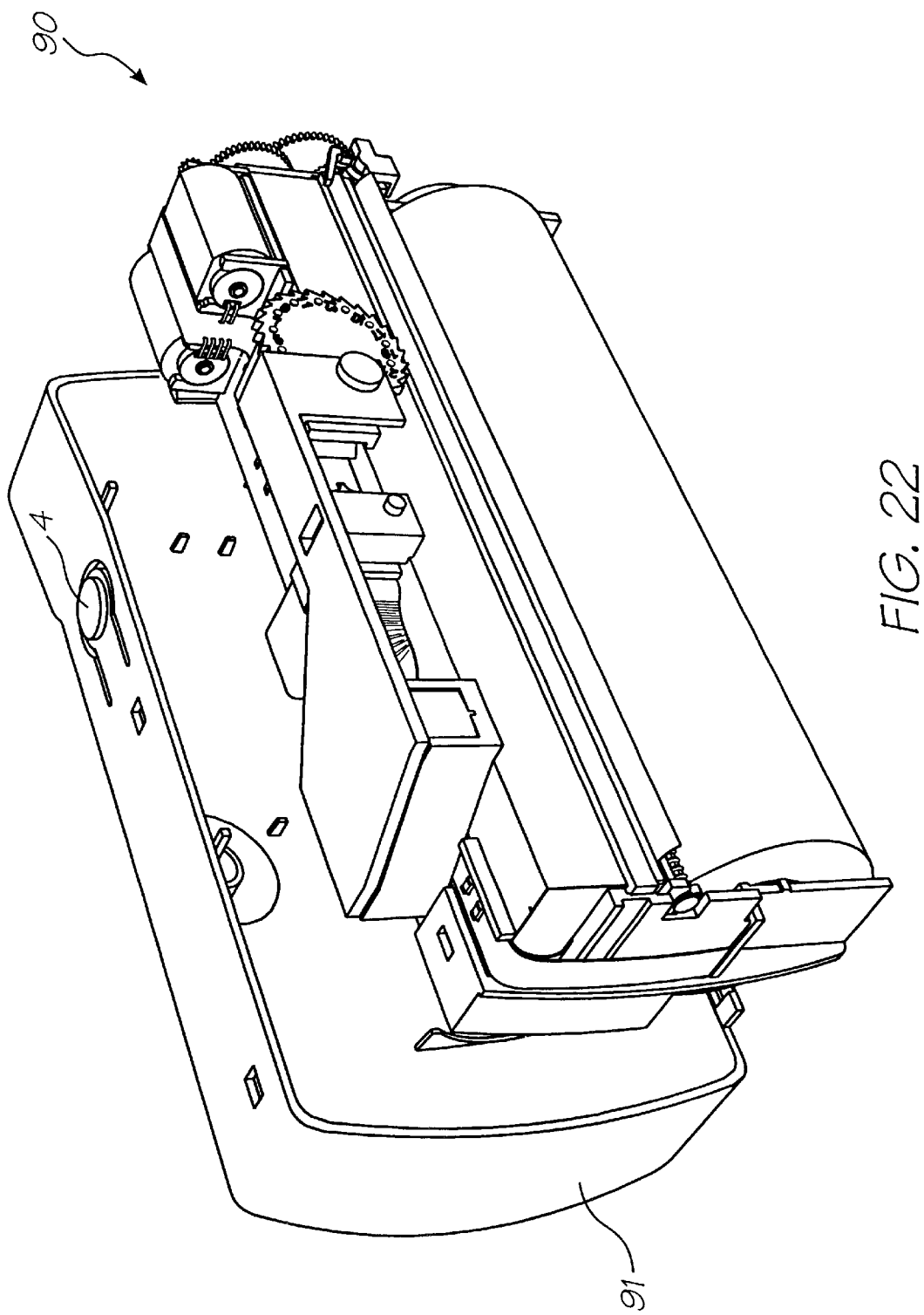
FIG. 22 illustrates the process of assembling the preferred embodiment.

Turning next to FIG. 22, the assembled unit 90 is then inserted into a front outer case 91 which includes button 4 for activation of printouts.

Figure 23:
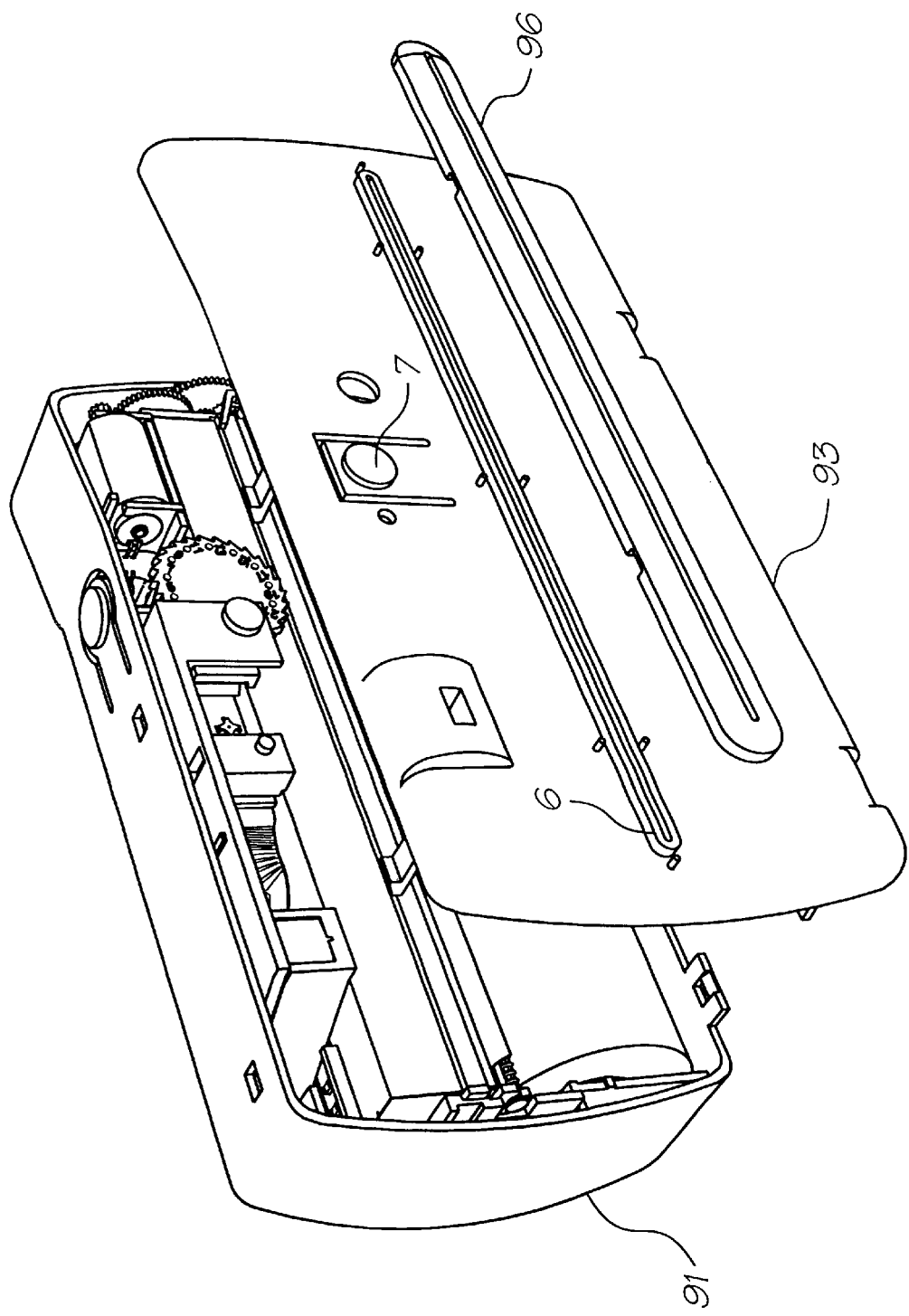
FIG. 23 is a perspective view further illustrating the assembly process of the preferred embodiment.

Turning now to FIG. 23, next, the unit 90 is provided with a snapon back cover 93 which includes a slot 6 and copy print button 7. A wrapper label containing instructions and advertising (not shown) is then wrapped around the outer surface of the camera system and pinch clamped to the cover by means of clamp strip 96 which can comprise a flexible plastic or rubber strip.

Subsequently, the preferred embodiment is ready for use as a one time use camera system that provides for instant output images on demand. It will be evident that the preferred embodiment further provides for a refillable camera system. A used camera can be collected and its outer plastic cases removed and recycled. A new paper roll and batteries can be added and the ink cartridge refilled. A series of automatic test routines can then be carried out to ensure that the printer is properly operational. Further, in order to ensure only authorised refills are conducted so as to enhance quality, routines in the on-chip program ROM can be executed such that the camera authenticates the refilling station using a secure protocol. Upon authentication, the camera can reset an internal paper count and an external case can be fitted on the camera system with a new outer label. Subsequent packing and shipping can then take place.

It will be further readily evident to those skilled in the art that the program ROM can be modified so as to allow for a variety of digital processing routines. In addition to the digitally enhanced photographs optimised for mainstream consumer preferences, various other models can readily be provided through mere re-programming of the program ROM. For example, a sepia classic old fashion style output can be provided through a remapping of the colour mapping function. A further alternative is to provide for black and white outputs again through a suitable colour remapping algorithm. Minimum colour can also be provided to add a touch of colour to black and white prints to produce the effect that was traditionally used to colourize black and white photos. Further, passport photo output can be provided through suitable address remappings within the address generators. Further, edge filters can be utilised as is known in the field of image processing to produce sketched art styles. Further, classic wedding borders and designs can be placed around an output image in addition to the provision of relevant clip arts. For example, a wedding style camera might be provided. Further, a panoramic mode can be provided so as to output the well known panoramic format of images. Further, a postcard style output can be provided through the printing of postcards including postage on the back of a print roll surface. Further, cliparts can be provided for special events such as Halloween, Christmas etc. Further, kaleidoscopic effects can be provided through address remappings and wild colour effects can be provided through remapping of the colour lookup table. Many other forms of special event cameras can be provided for example, cameras dedicated to the Olympics, movie tie-ins, advertising and other special events.

The operational mode of the camera can be programmed so that upon the depressing of the take photo a first image is sampled by the sensor array to determine irrelevant parameters. Next a second image is again captured which is utilised for the output. The captured image is then manipulated in accordance with any special requirements before being initially output on the paper roll. The LED light is then activated for a predetermined time during which the DRAM is refreshed so as to retain the image. If the print copy button is depressed during this predetermined time interval, a further copy of the photo is output. After the predetermined time interval where no use of the camera has occurred, the onboard CPU shuts down all power to the camera system until such time as the take button is again activated. In this way, substantial power savings can be realized.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per printhead, but is a major impediment to the fabrication of pagewidth printheads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the ink jet systems described below with differing levels of difficulty. Fortyfive different ink jet technologies have been developed by the Assignee to give a wide range of choices for high volume manufacture. These technologies form part of separate applications assigned to the present Assignee as set out in the table under the heading Cross References to Related Applications.

The ink jet designs shown here are suitable for a wide range of digital printing systems, from battery powered one-time use digital cameras, through to desktop and network printers, and through to commercial printing systems.

For ease of manufacture using standard process equipment, the printhead is designed to be a monolithic 0.5 micron CMOS chip with MEMS post processing. For color photographic applications, the printhead is 100 mm long, with a width which depends upon the ink jet type. The smallest printhead designed is IJ38, which is 0.35 mm wide, giving a chip area of 35 square mm. The printheads each contain 19,200 nozzles plus data and control circuitry.

Ink is supplied to the back of the printhead by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The printhead is connected to the camera circuitry by tape automated bonding.

Tables of Drop-on-Demand Ink Jets

The present invention is useful in the field of digital printing, in particular, ink jet printing.

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IJ01 to IJ45 which matches the docket numbers in the table under the heading Cross References to Related Applications.

Other ink jet configurations can readily be derived from these forty-five examples by substituting alternative configurations along one or more of the 11 axes. Most of the IJ01 to IJ45 examples can be made into ink jet printheads with characteristics superior to any currently available, ink jet technology.

Where there are prior art examples known to the inventor, one or more of these examples are listed in the examples column of the tables below. The IJ01 to IJ45 series are also listed in the examples column. In some cases, a print technology may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| | Description | Advantages | Disadvantages | Examples |
|---|---|---|---|---|
| ACTUATOR MECHANISM (APPLIED ONLY TO SELECTED INK DROPS) | | | | |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | Large force generated Simple construction No moving parts Fast operation Small chip area required for actuator | High power Ink carrier limited to water Low efficiency High temperatures required High mechanical stress Unusual materials required Large drive transistors Cavitation causes actuator failure Kogation reduces bubble formation Large print heads are difficult to fabricate | Canon Bubblejet 1979 Endo et al GB patent 2,007,162 Xerox heater-in-pit 1990 Hawkins et al U.S. Pat. No. 4,899,181 Hewlett-Packard TIJ 1982 Vaught et al U.S. Pat. No. 4,490,728 |
| Piezo-electric | A piezoelectric crystal such as lead lanthanum zirconate (PZT) is electrically activated, and either expands, shears, or bends to apply pressure to the ink, ejecting drops. | Low power consumption Many ink types can be used Fast operation High efficiency | Very large area required for actuator Difficult to integrate with electronics High voltage drive transistors required Full pagewidth print heads impractical due to actuator size Requires electrical poling in high field strengths during manufacture | Kyser et al U.S. Pat. No. 3,946,398 Zoltan U.S. Pat. No. 3,683,212 1973 Stemme U.S. Pat. No. 3,747,120 Epson Stylus Tektronix IJ04 |
| Electro-strictive | An electric field is used to activate electrostriction in relaxor materials such as lead lanthanum zirconate titanate (PLZT) or lead magnesium niobate (PMN). | Low power consumption Many ink types can be used Low thermal expansion Electric field strength required (approx. 3.5 V/$\mu$m) can be generated without difficulty Does not require electrical poling | Low maximum strain (approx. 0.01%) Large area required for actuator due to low strain Response speed is marginal (~10 $\mu$s) High voltage drive transistors required Full pagewidth print heads impractical due to actuator size | Seiko Epson, Usui et all JP 253401/96 IJ04 |
| Ferro-electric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | Low power consumption Many ink types can be used Fast operation (<1 $\mu$s) Relatively high longitudinal strain High efficiency Electric field strength of around 3 V/$\mu$m can be readily provided | Difficult to integrate with electronics Unusual materials such as PLZSnT are required Actuators require a large area | IJ04 |
| Electro-static plates | Conductive plates are separated by a | Low power consumption | Difficult to operate electrostatic | IJ02, IJ04 |

| | Description | Advantages | Disadvantages | Examples |
|---|---|---|---|---|
| | compressible or fluid dielectric (usually air). Upon application of a voltage, the plates attract each other and displace ink, causing drop ejection. The conductive plates may be in a comb or honeycomb structure, or stacked to increase the surface area and therefore the force. | Many ink types can be used Fast operation | devices in an aqueous environment The electrostatic actuator will normally need to be separated from the ink Very large area required to achieve high forces High voltage drive transistors may be required Full pagewidth print heads are not competitive due to actuator size | |
| Electro-static pull on ink | A strong electric field is applied to the ink, whereupon electrostatic attraction accelerates the ink towards the print medium. | Low current consumption Low temperature | High voltage required May be damaged by sparks due to air breakdown Required field strength increases as the drop size decreases High voltage drive transistors required Electrostatic field attracts dust | 1989 Saito et al, U.S. Pat. No. 4,799,068 1989 Miura et al, U.S. Pat. No. 4,810,954 Tone-jet |
| Permanent magnet electro-magnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | Low power consumption Many ink types can be used Fast operation High efficiency Easy extension from single nozzles to pagewidth print heads | Complex fabrication Permanent magnetic material such as Neodymium Iron Boron (NdFeB) required. High local currents required Copper metalization should be used for long electromigration lifetime and low resistivity Pigmented inks are usually infeasible Operating temperature limited to the Curie temperature (around 540 K) | IJ07, IJ10 |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | Low power consumption Many ink types can be used Fast operation High efficiency Easy extension from single nozzles to pagewidth print heads | Complex fabrication Materials not usually present in a CMOS fab such as NiFe, CoNiFe, or CoFe are required High local currents required Copper metalization should be used for long electromigration lifetime and low resistivity Electroplating is required High saturation flux density is required (2.0–2.1 T is achievable with CoNiFe [1]) | IJ01, IJ05, IJ08, IJ10, IJ12, IJ14, IJ15, IJ17 |

-continued

| | Description | Advantages | Disadvantages | Examples |
|---|---|---|---|---|
| Lorenz force | The Lorenz force acting on a current carrying wire in a magnetic field is utilized. This allows the magnetic field to be supplied externally to the print head, for example with rare earth permanent magnets. Only the current carrying wire need be fabricated on the print-head, simplifying materials requirements. | Low power consumption Many ink types can be used Fast operation High efficiency Easy extension from single nozzles to pagewidth print heads | Force acts as a twisting motion Typically, only a quarter of the solenoid length provides force in a useful direction High local currents required Copper metalization should be used for long electromigration lifetime and low resistivity Pigmented inks are usually infeasible | IJ06, IJ11, IJ13, IJ16 |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | Many ink types can be used Fast operation Easy extension from single nozzles to pagewidth print heads High force is available | Force acts as a twisting motion Unusual materials such as Terfenol-D are required High local currents required Copper metalization should be used for long electromigration lifetime and low resistivity Pre-stressing may be required | Fischenbeck, U.S. Pat. No. 4,032,929 IJ25 |
| Surface tension reduction | Ink under positive pressure is held in a nozzle by surface tension. The surface tension of the ink is reduced below the bubble threshold, causing the ink to egress from the nozzle. | Low power consumption Simple construction No unusual materials required in fabrication High efficiency Easy extension from single nozzles to pagewidth print heads | Requires supplementary force to effect drop separation Requires special ink surfactants Speed may be limited by surfactant properties | Silverbrook, EP 0771 658 A2 and related patent applications |
| Viscosity reduction | The ink viscosity is locally reduced to select which drops are to be ejected. A viscosity reduction can be achieved electrothermally with most inks, but special inks can be engineered for a 100:1 viscosity reduction. | Simple construction No unusual materials required in fabrication Easy extension from single nozzles to pagewidth print heads | Requires supplementary force to effect drop separation Requires special ink viscosity properties High speed is difficult to achieve Requires oscillating nk pressure A high temperature difference (typically 80 degrees) is required | Silverbrook, EP 0771 658 A2 and related patent applications |
| Acoustic | An acoustic wave is generated and focussed upon the drop ejection region. | Can operate without a nozzle plate | Complex drive circuitry Complex fabrication Low efficiency Poor control of drop position Poor control of drop volume | 1993 Hadimioglu et al, EUP 550,192 1993 Elrod et al, EUP 572,220 |
| Thermo-elastic bend actuator | An actuator which relies upon differential thermal expansion upon Joule heating is used. | Low power consumption Many ink types can be used Simple planar | Efficient aqueous operation requires a thermal insulator on the hot side Corrosion | IJ03, IJ09, IJ17, IJ18, IJ19, IJ20, IJ21, IJ22, IJ23, IJ24, IJ27, IJ28, IJ29, IJ30, IJ31, |

-continued

| | Description | Advantages | Disadvantages | Examples |
|---|---|---|---|---|
| | | fabrication<br>Small chip area required for each actuator<br>Fast operation<br>High efficiency<br>CMOS compatible voltages and currents<br>Standard MEMS processes can be used<br>Easy extension from single nozzles to pagewidth print heads | prevention can be difficult<br>Pigmented inks may be infeasible, as pigment particles may jam the bend actuator | IJ32, IJ33, IJ34, IJ35, IJ36, IJ37, IJ38, IJ39, IJ40, IJ41 |
| High CTE thermo-elastic actuator | A material with a very high coefficient of thermal expansion (CTE) such as polytetrafluoroethylene (PTFE) is used. As high CTE materials are usually non-conductive, a heater fabricated from a conductive material is incorporated. A 50 µm long PTFE bend actuator with polysilicon heater and 15 mW power input can provide 180 µN force and 10 µm deflection. Actuator motions include:<br>Bend<br>Push<br>Buckle<br>Rotate | High force can be generated<br>Three methods of PTFE deposition are under development: chemical vapor deposition (CVD), spin coating, and evaporation<br>PTFE is a candidate for low dielectric constant insulation in ULSI<br>Very low power consumption<br>Many ink types can be used<br>Simple planar fabrication<br>Small chip area required for each actuator<br>Fast operation<br>High efficiency<br>CMOS compatible voltages and currents<br>Easy extension from single nozzles to pagewidth print heads | Requires special material (e.g. PTFE)<br>Requires a PTFE deposition process, which is not yet standard in ULSI fabs<br>PTFE deposition cannot be followed with high temperature (above 350° C.) processing<br>Pigmented inks may be infeasible, as pigment particles may jam the bend actuator | IJ09, IJ17, IJ18, IJ20, IJ21, IJ22, IJ23, IJ24, IJ27, IJ28, IJ29, IJ30, IJ31, IJ42, IJ43, IJ44 |
| Conduct-ive polymer thermo-elastic actuator | A polymer with a high coefficient of thermal expansion (such as PTFE) is doped with conducting substances to increase its conductivity to about 3 orders of magnitude below that of copper. The conducting polymer expands when resistively heated.<br>Examples of conducting dopants include:<br>Carbon nanotubes<br>Metal fibers<br>Conductive polymers such as doped polythiophene<br>Carbon granules | High force can be generated<br>Very low power consumption<br>Many ink types can be used<br>Simple planar fabrication<br>Small chip area required for each actuator<br>Fast operation<br>High efficiency<br>CMOS compatible voltages and currents<br>Easy extension from single nozzles to pagewidth print heads | Requires special materials development (High CTE conductive polymer)<br>Requires a PTFE deposition process, which is not yet standard in ULSI fabs<br>PTFE deposition cannot be followed with high temperature (above 350° C.) processing<br>Evaporation and CVD deposition techniques cannot be used<br>Pigmented inks may be infeasible, as pigment particles may jam the bend actuator | IJ24 |
| Shape memory alloy | A shape memory alloy such as TiNi (also known as Nitinol - Nickel Titanium alloy developed at the Naval Ordnance Laboratory) | High force is available (stresses of hundreds of MPa)<br>Large strain is available (more than 3%) | Fatigue limits maximum number of cycles<br>Low strain (1%) is required to extend fatigue resistance | IJ26 |

-continued

|  | Description | Advantages | Disadvantages | Examples |
| --- | --- | --- | --- | --- |
|  | is thermally switched between its weak martensitic state and its high stiffness austenic state. The shape of the actuator in its martensitic state is deformed relative to the austenic shape. The shape change causes ejection of a drop. | High corrosion resistance Simple construction Easy extension from single nozzles to pagewidth print heads Low voltage operation | Cycle rate limited by heat removal Requires unusual materials (TiNi) The latent heat of transformation must be provided High current operation Requires pre-stressing to distort the martensitic state |  |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | Linear Magnetic actuators can be constructed with high thrust, long travel, and high efficiency using planar semiconductor fabrication techniques Long actuator travel is available Medium force is available Low voltage operation | Requires unusual semiconductor materials such as soft magnetic alloys (e.g. CoNiFe) Some varieties also require permanent magnetic materials such as Neodymium iron boron (NdFeB) Requires complex multi-phase drive circuitry High current operation | IJ12 |

BASIC OPERATION MODE

|  | Description | Advantages | Disadvantages | Examples |
| --- | --- | --- | --- | --- |
| Actuator directly pushes ink | This is the simplest mode of operation: the actuator directly supplies sufficient kinetic energy to expel the drop. The drop must have a sufficient velocity to overcome the surface tension. | Simple operation No external fields required Satelite drops can be avoided if drop velocity is less than 4 m/s Can be efficient, depending upon the actuator used | Drop repetition rate is usually limited to around 10 kHz. However, this is not fundamental to the method, but is related to the refill method normally used All of the drop kinetic energy must be provided by the actuator Satellite drops usually form if drop velocity is greater than 4.5 mls | Thermal ink jet Piezoelectric ink jet IJ01, IJ02, 1303, IJ04, IJ05, IJ06, IJ07, IJ09, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | Very simple print head fabrication can be used The drop selection means does not need to provide the energy required to separate the drop from the nozzle | Requires close proximity between the print head and the print media or transfer roller May require two print heads printing alternate rows of the image Monolithic color print heads are difficult | Silverbrook, EP 0771 658 A2 and related patent applications |
| Electro-static pull on ink | The drops to be printed are selected by some manner (e.g. thermally induced surface tension reduction of pressurized ink). Selected drops are separated from the ink in the nozzle by a strong electric field. | Very simple print head fabrication can be used The drop selection means does not need to provide the energy required to separate the drop from the nozzle | Requires very high electrostatic field Electrostatic field for small nozzle sizes is above air breakdown Electrostatic field may attract dust | Silverbrook, EP 0771 658 A2 and related patent applications Tone-Jet |
| Magnetic pull on ink | The drops to be printed are selected by some manner (e.g. thermally induced surface tension | Very simple print head fabrication can be used The drop selection means | Requires magnetic ink Ink colors other than black are difficult | Silverbrook, EP 0771 658 A2 and related patent applications |

-continued

|  | Description | Advantages | Disadvantages | Examples |
|---|---|---|---|---|
|  | reduction of pressurized ink). Selected drops are separated from the ink in the nozzle by a strong magnetic field acting on the magnetic ink. | does not need to provide the energy required to separate the drop from the nozzle | Requires very high magnetic fields |  |
| Shutter | The actuator moves a shutter to block ink flow to the nozzle. The ink pressure is pulsed at a multiple of the drop ejection frequency. | High speed (>50 kHz) operation can be achieved due to reduced refill time Drop timing can be very accurate The actuator energy can be very low | Moving parts are required Requires ink pressure modulator Friction and wear must be considered Stiction is possible | IJ13, IJ17, IJ21 |
| Shuttered grill | The actuator moves a shutter to block ink flow through a grill to the nozzle. The shutter movement need only be equal to the width of the grill holes. | Actuators with small travel can be used Actuators with small force can be used High speed (>50 kHz) operation can be achieved | Moving parts are required Requires ink pressure modulator Friction and wear must be considered Stiction is possible | IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | Extremely low energy operation is possible No heat dissipation problems | Requires an external pulsed magnetic field Requires special materials for both the actuator and the ink pusher Complex construction | IJ10 |

AUXILIARY MECHANISM (APPLIED TO ALL NOZZLES)

|  | Description | Advantages | Disadvantages | Examples |
|---|---|---|---|---|
| None | The actuator directly fires the ink drop, and there is no external field or other mechanism required. | Simplicity of construction Simplicity of operation Small physical size | Drop ejection energy must be supplied by individual nozzle actuator | Most ink jets, including piezoelectric and thermal bubble. IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | Oscillating ink pressure can provide a refill pulse, allowing higher operating speed The actuators may operate with much lower energy Acoustic lenses can be used to focus the sound on the nozzles | Requires external ink pressure oscillator Ink pressure phase and amplitude must be carefully controlled Acoustic reflections in the ink chamber must be designed for | Silverbrook, EP 0771 658 A2 and related patent applications IJ08, IJ13, IJ15, IJ17, IJ18, IJ19, IJ21 |
| Media proximity | The print head is placed in close proximity to the print medium. Selected drops protrude from the print head further than unselected drops, and contact the print medium. The drop | Low power High accuracy Simple print head construction | Precision assembly required Paper fibers may cause problems Cannot print on rough substrates | Silverbrook, EP 0771 658 A2 and related patent applications |

-continued

|  | Description | Advantages | Disadvantages | Examples |
|---|---|---|---|---|
|  | soaks into the medium fast enough to cause drop separation. |  |  |  |
| Transfer roller | Drops are printed to a transfer roller instead of straight to the print medium. A transfer roller can also be used for proximity drop separation. | High accuracy Wide range of print substrates can be used Ink can be dried on the transfer roller | Bulky Expensive Complex construction | Silverbrook, EP 0771 658 A2 and related patent applications Tektronix hot melt piezoelectric ink jet Any of the IJ series |
| Electro-static | An electric field is used to accelerate selected drops towards the print medium. | Low power Simple print head construction | Field strength required for separation of small drops is near or above air breakdown | Silverbrook, EP 0771 658 A2 and related patent applications Tone-Jet |
| Direct magnetic field | A magnetic field is used to accelerate selected drops of magnetic ink towards the print medium. | Low power Simple print head construction | Requires magnetic ink Requires strong magnetic field | Silverbrook, EP 0771 658 A2 and related patent applications |
| Cross magnetic field | The print head is placed in a constant magnetic field. The Lorenz force in a current carrying wire is used to move the actuator. | Does not require magnetic materials to be integrated in the print head manufacturing process | Requires external magnet Current densities may be high, resulting in electromigration problems | IJ06, IJ16 |
| Pulsed magnetic field | A pulsed magnetic field is used to cyclically attract a paddle, which pushes on the ink. A small actuator moves a catch, which selectively prevents the paddle from moving. | Very low power operation is possible Small print head size | Complex print head construction Magnetic materials required in print head | IJ10 |
| ACTUATOR AMPLIFICATION OR MODIFICATION METHOD |||||
| None | No actuator mechanical amplification is used. The actuator directly drives the drop ejection process. | Operational simplicity | Many actuator mechanisms have insufficient travel, or insufficient force, to efficiently drive the drop ejection process | Thermal Bubble Ink jet IJ01, IJ02, IJ06, IJ07, IJ16, IJ25, IJ26 |
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | Provides greater travel in a reduced print head area | High stresses are involved Care must be taken that the materials do not delaminate Residual bend resulting from high temperature or high stress during formation | Piezoelectric IJ03, IJ09, IJ17, IJ18, IJ19, IJ20, IJ21, IJ22, IJ23, IJ24, 1127, IJ29, IJ30, IJ31, IJ32, IJ33, IJ34, IJ35, IJ36, IJ37, IJ38, 1339, IJ42, 1343, IJ44 |
| Transient bend actuator | A trilayer bend actuator where the two outside layers are identical. This cancels bend due to ambient temperature and residual stress. The actuator only responds to transient heating of one side or the other. | Very good temperature stability High speed, as a new drop can be fired before heat dissipates Cancels residual stress of formation | High stresses are involved Care must be taken that the materials do not delaminate | IJ40, IJ41 |
| Reverse spring | The actuator loads a spring. When the actuator is turned off, the spring releases. This can reverse the force/distance curve of | Better coupling to the ink | Fabrication complexity High stress in the spring | IJ05, IJ11 |

| | Description | Advantages | Disadvantages | Examples |
|---|---|---|---|---|
| | the actuator to make it compatible with the force/time requirements of the drop ejection. | | | |
| Actuator stack | A series of thin actuators are stacked. This can be appropriate where actuators require high electric field strength, such as electrostatic and piezoelectric actuators. | Increased travel Reduced drive voltage | Increased fabrication complexity Increased possibility of short circuits due to pinholes | Some piezoelectric ink jets IJ04 |
| Multiple actuators | Multiple smaller actuators are used simultaneously to move the ink. Each actuator need provide only a portion of the force required. | Increases the force available from an actuator Multiple actuators can be positioned to control ink flow accurately | Actuator forces may not add linearly, reducing efficiency | IJ12, IJ13, IJ18, IJ20, IJ22, IJ28, IJ42, IJ43 |
| Linear Spring | A linear spring is used to transform a motion with small travel and high force into a longer travel, lower force motion. | Matches low travel actuator with higher travel requirements Non-contact method of motion transformation | Requires print head area for the spring | IJ15 |
| Coiled actuator | A bend actuator is coiled to provide greater travel in a reduced chip area. | Increases travel Reduces chip area Planar implementations are relatively easy to fabricate. | Generally restricted to planar implementations due to extreme fabrication difficulty in other orientations. | IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | Simple means of increasing travel of a bend actuator | Care must be taken not to exceed the elastic limit in the flexure area Stress distribution is very uneven Difficult to accurately model with finite element analysis | IJ10, IJ19, IJ33 |
| Catch | The actuator controls a small catch. The catch either enables or disables movement of an ink pusher that is controlled in a bulk manner. | Very low actuator energy Very small actuator size | Complex construction Requires external force Unsuitable for pigmented inks | IJ10 |
| Gears | Gears can be used to increase travel at the expense of duration. Circular gears, rack and pinion, ratchets, and other gearing methods can be used. | Low force, low travel actuators can be used Can be fabricated using standard surface MEMS processes | Moving parts are required Several actuator cycles are required More complex drive electronics Complex construction Friction, friction, and wear are possible | IJ13 |
| Buckle plate | A buckle plate can be used to change a slow actuator into a fast motion. It can also convert a high force, low travel actuator into a high travel, medium force motion. | Very fast movement achievable | Must stay within elastic limits of the materials for long device life High stresses involved Generally high power requirement | S. Hirata et al, "An Ink-jet Head Using Diaphragm Microactuator", Proc. IEEE MEMS, Feb. 1996, pp 418– 423. IJ18, IJ27 |

-continued

|  | Description | Advantages | Disadvantages | Examples |
|---|---|---|---|---|
| Tapered magnetic pole | A tapered magnetic pole can increase travel at the expense of force. | Linearizes the magnetic force/distance curve | Complex construction | IJ14 |
| Lever | A lever and fulcrum is used to transform a motion with small travel and high force into a motion with longer travel and lower force. The lever can also reverse the direction of travel. | Matches low travel actuator with higher travel requirements Fulcrum area has no linear movement, and can be used for a fluid seal | High stress around the fulcrum | IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | High mechanical advantage The ratio of force to travel of the actuator can be matched to the nozzle requirements by varying the number of impeller vanes | Complex construction Unsuitable for pigmented inks | IJ28 |
| Acoustic lens | A refractive or diffractive (e.g. zone plate) acoustic lens is used to concentrate sound waves. | No moving parts | Large area required Only relevant for acoustic ink jets | 1993 Hadimioglu et al, EUP 550,192 1993 Elrod et al, EUP 572,220 |
| Sharp conductive point | A sharp point is used to concentrate an electrostatic field. | Simple construction | Difficult to fabricate using standard VLSI processes for a surface ejecting ink-jet Only relevant for electrostatic ink jets | Tone-jet |

ACTUATOR MOTION

|  | Description | Advantages | Disadvantages | Examples |
|---|---|---|---|---|
| Volume expansion | The volume of the actuator changes, pushing the ink in all directions. | Simple construction in the case of thermal ink jet | High energy is typically required to achieve volume expansion. This leads to thermal stress, cavitation, and kogation in thermal ink jet implementations | Hewlett-Packard Thermal Ink jet Canon Bubblejet |
| Linear, normal to chip surface | The actuator moves in a direction normal to the print head surface. The nozzle is typically in the line of movement. | Efficient coupling to ink drops ejected normal to the surface | High fabrication complexity may be required to achieve perpendicular motion | IJ01, IJ02, IJ04, IJ07, IJ11, IJ14 |
| Parallel to chip surface | The actuator moves parallel to the print bead surface. Drop ejection may still be normal to the surface. | Suitable for planar fabrication | Fabrication complexity Friction Stiction | IJ12, IJ13, IJ15, IJ33, IJ34, IJ35, IJ36 |
| Membrane push | An actuator with a high force but small area is used to push a stiff membrane that is in contact with the ink. | The effective area of the actuator becomes the membrane area | Fabrication complexity Actuator size Difficulty of integration in a VLSI process | 1982 Howkins U.S. Pat. No. 4,459,601 |
| Rotary | The actuator causes the rotation of some element, such a grill or impeller | Rotary levers may be used to increase travel Small chip area requirements | Device complexity May have friction at a pivot point | IJ05, IJ08, IJ13, IJ28 |
| Bend | The actuator bends when energized. This may be due to differential thermal expansion, piezoelectric expansion, magnetostriction, or | A very small change in dimensions can be converted to a large motion. | Requires the actuator to be made from at least two distinct layers, or to have a thermal difference across the actuator | 1970 Kyser et al U.S. Pat. No. 3,946,398 1973 Stemme U.S. Pat. No. 3,747,120 IJ03, IJ09, IJ10, IJ19, IJ23, IJ24, |

-continued

| | Description | Advantages | Disadvantages | Examples |
|---|---|---|---|---|
| | other form of relative dimensional change. | | | IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | Allows operation where the net linear force on the paddle is zero Small chip area requirements | Inefficient coupling to the ink motion | IJ06 |
| Straighten | The actuator is normally bent, and straightens when energized. | Can be used with shape memory alloys where the austenic phase is planar | Requires careful balance of stresses to ensure that the quiescent bend is accurate | IJ26, IJ32 |
| Double bend | The actuator bends in one direction when one element is energized, and bends the other way when another element is energized. | One actuator can be used to power two nozzles. Reduced chip size. Not sensitive to ambient temperature | Difficult to make the drops ejected by both bend directions identical. A small efficiency loss compared to equivalent single bend actuators. | IJ36, IJ37, IJ38 |
| Shear | Energizing the actuator causes a shear motion in the actuator material. | Can increase the effective travel of piezoelectric actuators | Not readily applicable to other actuator mechanisms | 1985 Fishbeck U.S. Pat. No. 4,584,590 |
| Radial constriction | The actuator squeezes an ink reservoir, forcing ink from a constricted nozzle. | Relatively easy to fabricate single nozzles from glass tubing as macroscopic structures | High force required Inefficient Difficult to integrate with VLSI processes | 1970 Zoltan U.S. Pat. No. 3,683,212 |
| Coil/uncoil | A coiled actuator uncoils or coils more tightly. The motion of the free end of the actuator ejects the ink. | Easy to fabricate as a planar VLSI process Small area required, therefore low cost | Difficult to fabricate for non-planar devices Poor out-of-plane stiffness | IJ17, IJ21, IJ34, IJ35 |
| Bow | The actuator bows (or buckles) in the middle when energized. | Can increase the speed of travel Mechanically rigid | Maximum travel is constrained High force required | IJ16, IJ18, IJ27 |
| Push-Pull | Two actuators control a shutter. One actuator pulls the shutter, and the other pushes it. | The structure is pinned at both ends, so has a high out-of-plane rigidity | Not readily suitable for ink jets which directly push the ink | IJ18 |
| Curl inwards | A set of actuators curl inwards to reduce the volume of ink that they enclose. | Good fluid flow to the region behind the actuator increases efficiency | Design complexity | IJ20, IJ42 |
| Curl outwards | A set of actuators curl outwards, pressurizing ink in a chamber surrounding the actuators, and expelling ink from a nozzle in the chamber. | Relatively simple construction | Relatively large chip area | IJ43 |
| Iris | Multiple vanes enclose a volume of ink. These simultaneously rotate, reducing the volume between the vanes. | High efficiency Small chip area | High fabrication complexity Not suitable for pigmented inks | IJ22 |
| Acoustic vibration | The actuator vibrates at a high frequency. | The actuator can be physically distant from the ink | Large area required for efficient operation at useful frequencies Acoustic coupling and crosstalk Complex drive circuitry Poor control of drop volume and position | 1993 Hadimioglu et al, EUP 550,192 1993 Elrod et al, EUP 572,220 |

-continued

| | Description | Advantages | Disadvantages | Examples |
|---|---|---|---|---|
| None | In various ink jet designs the actuator does not move. | No moving parts | Various other tradeoffs are required to eliminate moving parts | Silverbrook, EP 0771 658 A2 and related patent applications Tone-jet |

NOZZLE REFILL METHOD

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | Fabrication simplicity Operational simplicity | Low speed Surface tension force relatively small compared to actuator force Long refill time usually dominates the total repetition rate | Thermal ink jet Piezoelectric ink jet IJ01–IJ07, IJ10–IJ14, IJ16, IJ20, IJ22–IJ45 |
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. The shutter is then closed to prevent the nozzle chamber emptying during the next negative pressure cycle. | High speed Low actuator energy, as the actuator need only open or close the shutter, instead of ejecting the ink drop | Requires common ink pressure oscillator May not be suitable for pigmented inks | IJ08, IJ13, IJ15, IJ17, IJ18, IJ19, IJ21 |
| Refill actuator | After the main actuator bas ejected a drop a second (refill) actuator is energized. The refill actuator pushes ink into the nozzle chamber. The refill actuator returns slowly, to prevent its return from emptying the chamber again. | High speed, as the nozzle is actively refilled | Requires two independent actuators per nozzle | IJ09 |
| Positive ink pressure | The ink is held a slight positive pressure. After the ink drop is ejected, the nozzle chamber fills quickly as surface tension and ink pressure both operate to refill the nozzle. | High refill rate, therefore a high drop repetition rate is possible | Surface spill must be prevented Highly hydrophobic print head surfaces are required | Silverbrook, EP 0771 658 A2 and related patent applications Alternative for:, IJ01–IJ07, IJ10–IJ14, IJ16, IJ20, IJ22–IJ45 |

METHOD OF RESTRICTING BACK-FLOW THROUGH INLET

| | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | Design simplicity Operational simplicity Reduces crosstalk | Restricts refill rate May result in a relatively large chip area Only partially effective | Thermal ink jet Piezoelectric ink jet IJ42, IJ43 |
| Positive ink pressure | The ink is under a positive pressure, so that in the quiescent state some of the ink drop already protrudes from the nozzle. This reduces the pressure in the nozzle | Drop selection and separation forces can be reduced Fast refill time | Requires a method (such as a nozzle rim or effective hydrophobizing, or both) to prevent flooding of the ejection surface of | Silverbrook, EP 0771 658 A2 and related patent applications Possible operation of the following: IJ01–IJ07, IJ09–IJ12, |

-continued

|  | Description | Advantages | Disadvantages | Examples |
| --- | --- | --- | --- | --- |
|  | chamber which is required to eject a certain volume of ink. The reduction in chamber pressure results in a reduction in ink pushed out through the inlet. |  | the print head. | IJ14, IJ16, IJ20, IJ22, IJ23–IJ34, IJ36–IJ41, IJ44 |
| Baffle | One or more baffles are placed in the inlet ink flow. When the actuator is energized, the rapid ink movement creates eddies which restrict the flow through the inlet. The slower refill process is unrestricted, and does not result in eddies. | The refill rate is not as restricted as the long inlet method. Reduces crosstalk | Design complexity May increase fabrication complexity (e.g. Tektronix hot melt Piezoelectric print heads). | HP Thermal Ink Jet Tektronix piezoelectric ink jet |
| Flexible flap restricts inlet | In this method recently disclosed by Canon, the expanding actuator (bubble) pushes on a flexible flap that restricts the inlet. | Significantly reduces back-flow for edge-shooter thermal ink jet devices | Not applicable to most ink jet configurations Increased fabrication complexity Inelastic deformation of polymer flap results in creep over extended use | Canon |
| Inlet filter | A filter is located between the ink inlet and the nozzle chamber. The filter has a multitude of small holes or slots, restricting ink flow. The filter also removes particles which may block the nozzle. | Additional advantage of ink filtration Ink filter may be fabricated with no additional process steps | Restricts refill rate May result in complex construction | IJ04, IJ12, IJ24, IJ27, IJ29, IJ30 |
| Small inlet compared to nozzle | The ink inlet channel to the nozzle chamber has a substantially smaller cross section than that of the nozzle resulting in easier ink egress out of the nozzle than out of the inlet. | Design simplicity | Restricts refill rate May result in a relatively large chip area Only partially effective | IJ02, IJ37, IJ44 |
| Inlet shutter | A secondary actuator controls the position of a shutter, closing off the ink inlet when the main actuator is energized. | Increases speed of the ink-jet print head operation | Requires separate refill actuator and drive circuit | IJ09 |
| The inlet is located behind the ink-pushing surface | The method avoids the problem of inlet back-flow by arranging the ink-pushing surface of the actuator between the inlet and the nozzle. | Back-flow problem is eliminated | Requires careful design to minimize the negative pressure behind the paddle | IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | Significant reductions in back-flow can be achieved Compact designs possible | Small increase in fabrication complexity | IJ07, IJ20, IJ26, IJ38 |
| Nozzle actuator does not result in ink back-flow | In some configurations of ink jet, there is no expansion or movement of an actuator which may cause ink back-flow through the inlet. | Ink back-flow problem is eliminated | None related to ink back-flow on actuation | Silverbrook, EP 0771 658 A2 and related patent applications Valve-jet Tone-jet |

-continued

|  | Description | Advantages | Disadvantages | Examples |
|---|---|---|---|---|
| NOZZLE CLEARING METHOD | | | | |
| Normal nozzle firing | All of the nozzles are fired periodically, before the ink has a chance to dry. When not in use the nozzles are sealed (capped) against air. The nozzle firing is usually performed during a special clearing cycle, after first moving the print head to a cleaning station. | No added complexity on the print head | May not be sufficient to displace dried ink | Most ink jet systems IJ01, IJ02, 1303, IJ04, IJ05, IJ06, IJ07, IJ09, IJ10, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, IJ39, IJ40, IJ41, IJ42, IJ43, IJ44,, IJ45 |
| Extra power to ink heater | In systems which heat the ink, but do not boil it under normal situations, nozzle clearing can be achieved by over-powering the heater and boiling ink at the nozzle. | Can be highly effective if the heater is adjacent to the nozzle | Requires higher drive voltage for clearing May require larger drive transistors | Silverbrook, EP 0771 658 A2 and related patent applications |
| Rapid success-ion of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | Does not require extra drive circuits on the print head Can be readily controlled and initiated by digital logic | Effectiveness depends substantially upon the configuration of the ink jet nozzle | May be used with: IJ01, IJ02, IJ03, IJ04, IJ05, IJ06, IJ07, IJ09, IJ10, IJ11, IJ14, IJ16, IJ20, IJ22, IJ23, IJ24, IJ25, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink pushing actuator | Where an actuator is not normally driven to the limit of its motion, nozzle clearing may be assisted by providing an enhanced drive signal to the actuator. | A simple solution where applicable | Not suitable where there is a hard limit to actuator movement | May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | A high nozzle clearing capability can be achieved May be implemented at very low cost in systems which already include acoustic actuators | High implementation cost if system does not already include an acoustic actuator | IJ08, IJ13, IJ15, IJ17, IJ18, IJ19, IJ21 |
| Nozzle cleaning plate | A microfabricated plate is pushed against the nozzles. The plate has a post for every nozzle. A post moves through each nozzle, displacing dried ink. | Can clear severely clogged nozzles | Accurate mechanical alignment is required Moving parts are required There is risk of damage to the nozzles Accurate fabrication is required | Silverbrook, EP 0771 658 A2 and related patent applications |
| Ink pressure pulse | The pressure of the ink is temporarily increased so that ink streams from all of the | May be effective where other methods cannot be used | Requires pressure pump or other pressure actuator | May be used with all IJ series ink jets |

-continued

|  | Description | Advantages | Disadvantages | Examples |
|---|---|---|---|---|
|  | nozzles. This may be used in conjunction with actuator energizing. |  | Expensive Wasteful of ink |  |
| Print head wiper | A flexible 'blade' is wiped across the print head surface. The blade is usually fabricated from a flexible polymer, e.g. rubber or synthetic elastomer. | Effective for planar print head surfaces Low cost | Difficult to use if print head surface is non-planar or very fragile Requires mechanical parts Blade can wear out in high volume print systems | Many ink jet systems |
| Separate ink boiling heater | A separate heater is provided at the nozzle although the normal drop e-ection mechanism does not require it. The heaters do not require individual drive circuits, as many nozzles can be cleared simultaneously, and no imaging is required. | Can be effective where other nozzle clearing methods cannot be used Can be implemented at no additional cost in some ink jet configurations | Fabrication complexity | Can be used with many IJ series ink jets |

NOZZLE PLATE CONSTRUCTION

| Electro-formed nickel | A nozzle plate is separately fabricated from electroformed nickel, and bonded to the print bead chip. | Fabrication simplicity | High temperatures and pressures are required to bond nozzle plate Minimum thickness constraints Differential thermal expansion | Hewlett Packard Thermal Ink jet |
|---|---|---|---|---|
| Laser ablated or drilled polymer | Individual nozzle holes are ablated by an intense UV laser in a nozzle plate, which is typically a polymer such as polyimide or polysulphone | No masks required Can be quite fast Some control over nozzle profile is possible Equipment required is relatively low cost | Each hole must be individually formed Special equipment required Slow where there are many thousands of nozzles per print head May produce thin burrs at exit holes | Canon Bubblejet 1988 Sercel et al., SPIE, Vol. 998 Excimer Beam Applications, pp. 76–83 1993 Watanabe et al., U.S. Pat. No. 5,208,604 |
| Silicon micro-machined | A separate nozzle plate is micromachined from single crystal silicon, and bonded to the print head wafer. | High accuracy is attainable | Two part construction High cost Requires precision alignment Nozzles may be clogged by adhesive | K. Bean, IEEE Transactions on Electron Devices, Vol. ED-25, No. 10, 1978, pp 1185–1195 Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print beads with thousands of nozzles. | No expensive equipment required Simple to make single nozzles | Very small nozzle sizes are difficult to form Not suited for mass production | 1970 Zoltan U.S. Pat. No. 3,683,212 |
| Monolithic, surface micro-machined using VLSI litho-graphic processes | The nozzle plate is deposited as a layer using standard VLSI deposition techniques. Nozzles are etched in the nozzle plate using VLSI lithography and etching. | High accuracy (<1 $\mu$m) Monolithic Low cost Existing processes can be used | Requires sacrificial layer under the nozzle plate to form the nozzle chamber Surface may be fragile to the touch | Silverbrook, EP 0771 658 A2 and related patent applications IJ01, IJ02, IJ04, IJ11, IJ12, IJ17, IJ18, IJ20, IJ22, IJ24, IJ27, IJ28, IJ29, IJ30, IJ31, IJ32, IJ33, IJ34, IJ36, IJ37, IJ38, |

-continued

| | Description | Advantages | Disadvantages | Examples |
|---|---|---|---|---|
| Monolithic, etched through substrate | The nozzle plate is a buried etch stop in the wafer. Nozzle chambers are etched in the front of the wafer, and the wafer is thinned from the back side. Nozzles are then etched in the etch stop layer. | High accuracy (<1 μm) Monolithic Low cost No differential expansion | Requires long etch times Requires a support wafer | IJ39, IJ40, IJ41, IJ42, IJ43, IJ44 IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | No nozzles to become clogged | Difficult to control drop position accurately Crosstalk problems | Ricoh 1995 Sekiya et al U.S. Pat. No. 5,412,413 1993 Hadimioglu et al EUP 550,192 1993 Elrod et al EUP 572,220 |
| Trough | Each drop ejector has a trough through which a paddle moves. There is no nozzle plate. | Reduced manufacturing complexity Monolithic | Drop firing direction is sensitive to wicking. | IJ35 |
| Nozzle slit instead of individual nozzles | The elimination of nozzle holes and replacement by a slit encompassing many actuator positions reduces nozzle clogging, but increases crosstalk due to ink surface waves | No nozzles to become clogged | Difficult to control drop position accurately Crosstalk problems | 1989 Saito et al U.S. Pat. No. 4,799,068 |
| DROP EJECTION DIRECTION | | | | |
| Edge ('edge shooter') | Ink flow is along the surface of the chip, and ink drops are ejected from the chip edge. | Simple construction No silicon etching required Good heat sinking via substrate Mechanically strong Ease of chip handing | Nozzles limited to edge High resolution is difficult Fast color printing requires one print head per color | Canon Bubblejet 1979 Endo et al GB patent 2,007,162 Xerox heater-in-pit 1990 Hawkins et al U.S. Pat. No. 4,899,181 Tone-jet |
| Surface ('roof shooter') | Ink flow is along the surface of the chip, and ink drops are ejected from the chip surface, normal to the plane of the chip. | No bulk silicon etching required Silicon can make an effective heat sink Mechanical strength | Maximum ink flow is severely restricted | Hewlett-Packard TIJ 1982 Vaught et al U.S. Pat. No. 4,490,728 IJ02, IJ11, IJ12, IJ20, IJ22 |
| Through chip, forward ('up shooter') | Ink flow is through the chip, and ink drops are ejected from the front surface of the chip. | High ink flow Suitable for pagewidth print heads High nozzle packing density therefore low manufacturing cost | Requires bulk silicon etching | Silverbrook, EP 0771 658 A2 and related patent applications IJ04, IJ17, IJ18, IJ24, IJ27–IJ45 |
| Through chip, reverse ('down shooter') | Ink flow is through the chip, and ink drops are ejected from the rear surface of the chip. | High ink flow Suitable for pagewidth print heads High nozzle packing density therefore low manufacturing cost | Requires wafer thinning Requires special handling during manufacture | IJ01, IJ03, IJ05, IJ06, IJ07, IJ08, IJ09, IJ10, IJ13, IJ14, IJ15, IJ16, IJ19, IJ21, IJ23, IJ25, IJ26 |
| Through actuator | Ink flow is through the actuator, which is not fabricated as part of the same substrate as the drive transistors. | Suitable for piezoelectric print heads | Pagewidth print heads require several thousand connections to drive circuits Cannot be manufactured in | Epson Stylus Tektronix hot melt piezoelectric ink jets |

-continued

|  | Description | Advantages | Disadvantages | Examples |
|---|---|---|---|---|
|  |  |  | standard CMOS fabs Complex assembly required |  |
| INK TYPE |  |  |  |  |
| Aqueous, dye | Water based ink which typically contains: water, dye, surfactant, humectant, and biocide. Modern ink dyes have high water-fastness, light fastness | Environmentally friendly No odor | Slow drying Corrosive Bleeds on paper May strikethrough Cockles paper | Most existing ink jets All IJ series ink jets Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | Environmentally friendly No odor Reduced bleed Reduced wicking Reduced strikethrough | Slow drying Corrosive Pigment may clog nozzles Pigment may clog actuator mechanisms Cockles paper | IJ02, IJ04, IJ21, IJ26, IJ27, IJ30 Silverbrook, EP 0771 658 A2 and related patent applications Piezoelectric ink-jets Thermal ink jets (with significant restrictions) |
| Methyl Ethyl Ketone (MEK) | MEK is a highly volatile solvent used for industrial printing on difficult surfaces such as aluminum cans. | Very fast drying Prints on various substrates such as metals and plastics | Odorous Flammable | All IJ series ink jets |
| Alcohol (ethanol, 2-butanol, and others) | Alcohol based inks can be used where the printer must operate at temperatures below the freezing point of water. An example of this is in-camera consumer photographic printing. | Fast drying Operates at sub-freezing temperatures Reduced paper cockle Low cost | Slight odor Flammable | All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | No drying time- ink instantly freezes on the print medium Almost any print medium can be used No paper cockle occurs No wicking occurs No bleed occurs No strikethrough occurs | High viscosity Printed ink typically has a 'waxy' feel Printed pages may 'block' Ink temperature may be above the curie point of permanent magnets Ink heaters consume power Long warm-up time | Tektronix hot melt piezoelectric ink jets 1989 Nowak U.S. Pat. No. 4,820,346 All IJ series ink jets |
| Oil | Oil based inks are extensively used in offset printing. They have advantages in improved characteristics on paper (especially no wicking or cockle). Oil soluble dies and pigments are required. | High solubility medium for some dyes Does not cockle paper Does not wick through paper | High viscosity: this is a significant limitation for use in ink jets, which usually require a low viscosity. Some short chain and multi-branched oils have a sufficiently low viscosity. Slow drying | All IJ series ink jets |
| Micro-emulsion | A microemulsion is a stable, self forming emulsion of oil, water, and surfactant. The characteristic drop size is less than 100 nm, and is determined by the preferred curvature of the surfactant. | Stops ink bleed High dye solubility Water, oil, and amphiphilic soluble dies can be used Can stabilize pigment suspensions | Viscosity higher than water Cost is slightly higher than water based ink High surfactant concentration required (around 5%) | All IJ series ink jets |

What is claimed is:

1. A recyclable, one-time use, print on demand, digital camera comprising:
   an image sensor device for sensing an image;
   a processing means for processing said sensed image;
   a storage means for storing images and programs for utilisation by said processing means;
   a supply of print media stored internally to said camera;
   a pagewidth print head for printing said sensed image on said print media, the print head being fixedly mounted on a structure of the camera; and
   a solid state control means, fixed within the camera, to which said processing means is responsive to modify characteristics of the image to be printed on said print media depending on a state of the control means.

2. A camera as claimed in claim 1 wherein when said control means is in a first state, said processing means causes the print media to print modified images selected from the group of: digitally enhanced standard color images, sepia color images, black and white images, black and white images with minor color additions, multi-passport photograph images, sketch simulated images, bordered images, panoramic images, images with additional clip arts, kaleidoscopic effect images, and color modified images.

3. A camera as claimed in claim 2 further comprising a detachable jacket having printed information on its surface which is indicative of the type of effect produced by said control means when said control means is in said first state.

4. A camera as claimed in claim 1 wherein said image sensor device, said processing means and said control means are created on a single integrated circuit device, said device being programmable by, and connectable to, a programming device arranged externally of said camera with said control means being responsive to a command from said programming device to cause it to change its state.

5. A recyclable, one-time use, print on demand, digital camera comprising:
   an image sensing means for sensing an image;
   a processing means for processing said sensed image;
   a solid state control means, fixed within the camera, for controlling operation of the processing means, the control means causing, subject to a state of the control means, modification of said sensed image by the processing means to provide an application-specific modified image;
   a pagewidth print head responsive to the processing means for printing said sensed image, the print head being fixedly mounted on a structure of the camera; and
   a supply of print media on to which the modified, sensed image is printed by the print head to be output from the camera.

6. A camera as claimed in claim 5 in which the processing means includes a microprocessor and in which the control means includes a memory device associated with the microprocessor.

7. A camera as claimed in claim 6 in which the memory device is inaccessible by a user of the camera.

8. A camera as claimed in claim 6 in which the memory device is a programmable memory device which is accessed for re-programming upon recycling of the camera.

9. A camera as claimed in claim 5 in which the application-specific, modified image is selected from the group comprising digitally enhanced standard color images, sepia color images, black and white images, black and white images with minor color additions, multi-passport photograph images, sketch simulated images, bordered images, panoramic images, images with additional clip arts, kaleidoscope effect images, color modified images, and images related to predetermined events.

* * * * *